US010622367B1

(12) United States Patent
Nishikawa et al.

(10) Patent No.: US 10,622,367 B1
(45) Date of Patent: Apr. 14, 2020

(54) THREE-DIMENSIONAL MEMORY DEVICE INCLUDING THREE-DIMENSIONAL BIT LINE DISCHARGE TRANSISTORS AND METHOD OF MAKING THE SAME

(71) Applicant: SANDISK TECHNOLOGIES LLC, Addison, TX (US)

(72) Inventors: Masatoshi Nishikawa, Nagoya (JP); Hardwell Chibvongodze, Hiratsuka (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 15 days.

(21) Appl. No.: 16/142,644

(22) Filed: Sep. 26, 2018

(51) Int. Cl.
| | |
|---|---|
| H01L 27/11529 | (2017.01) |
| H01L 27/11556 | (2017.01) |
| H01L 27/11582 | (2017.01) |
| H01L 27/11573 | (2017.01) |
| H01L 27/11565 | (2017.01) |
| H01L 27/1157 | (2017.01) |
| G11C 16/04 | (2006.01) |
| G11C 16/26 | (2006.01) |
| H01L 27/11519 | (2017.01) |
| H01L 27/11524 | (2017.01) |

(52) U.S. Cl.
CPC .... H01L 27/11529 (2013.01); G11C 16/0483 (2013.01); G11C 16/26 (2013.01); H01L 27/1157 (2013.01); H01L 27/11519 (2013.01); H01L 27/11524 (2013.01); H01L 27/11556 (2013.01); H01L 27/11565 (2013.01); H01L 27/11573 (2013.01); H01L 27/11582 (2013.01)

(58) Field of Classification Search
None
See application file for complete search history.

(56) References Cited

U.S. PATENT DOCUMENTS

| | | | |
|---|---|---|---|
| 5,915,167 A | 6/1999 | Leedy | |
| 7,974,133 B2 | 7/2011 | Dunga et al. | |
| 8,865,535 B2 | 10/2014 | Rabkin et al. | |
| 9,515,085 B2 | 12/2016 | Rabkin et al. | |
| 9,576,967 B1 * | 2/2017 | Kimura | H01L 27/11565 |
| 9,595,535 B1 | 3/2017 | Ogawa et al. | |
| 9,620,512 B1 * | 4/2017 | Nishikawa | H01L 27/11524 |

(Continued)

OTHER PUBLICATIONS

Notification of Transmittal of the International Search Report and Written Opinion of the International Search Authority for International Patent Application No. PCT/US2019/034194, dated Sep. 18, 2019, 9 pages.

(Continued)

*Primary Examiner* — Andres Munoz
(74) *Attorney, Agent, or Firm* — The Marbury Law Group PLLC

(57) ABSTRACT

A three-dimensional memory device includes a first alternating stack of first insulating layers and first electrically conductive layers located over a substrate, memory stack structures extending through the first alternating stack, and bit lines overlying the memory stack structures. Vertical discharge transistors are provided, each of which includes a respective vertical discharge transistor channel that extends through a second alternating stack of second insulating layers and second electrically conductive layers laterally spaced from the first alternating stack.

20 Claims, 37 Drawing Sheets

61/110

(56) References Cited

U.S. PATENT DOCUMENTS

| | | | |
|---|---|---|---|
| 10,115,459 B1* | 10/2018 | Yamada | G11C 13/0002 |
| 2011/0140070 A1 | 6/2011 | Kim | |
| 2013/0273700 A1 | 10/2013 | Rabkin et al. | |
| 2015/0041901 A1 | 2/2015 | Son et al. | |
| 2015/0380089 A1 | 12/2015 | Aritome | |
| 2016/0005753 A1 | 1/2016 | Nowak et al. | |
| 2016/0141294 A1* | 5/2016 | Peri | H01L 21/28512 257/324 |
| 2017/0077118 A1 | 3/2017 | Cheng et al. | |

OTHER PUBLICATIONS

Endoh et al., "Novel Ultra High Density Memory with a Stacked-Surrounding Gate Transistor (S-SGT) Structured Cell," IEDM Proc. (2001) 33-36.

* cited by examiner

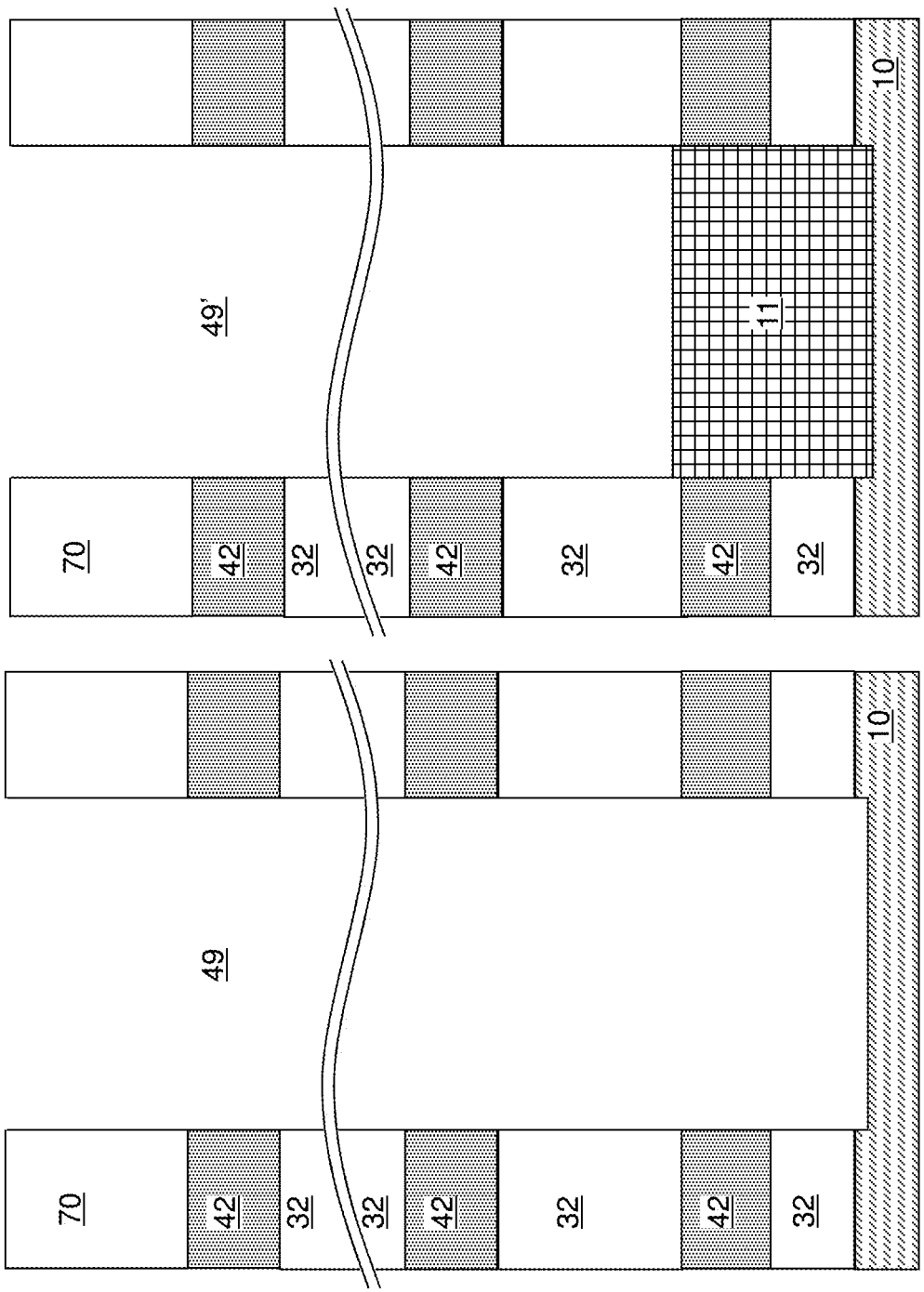

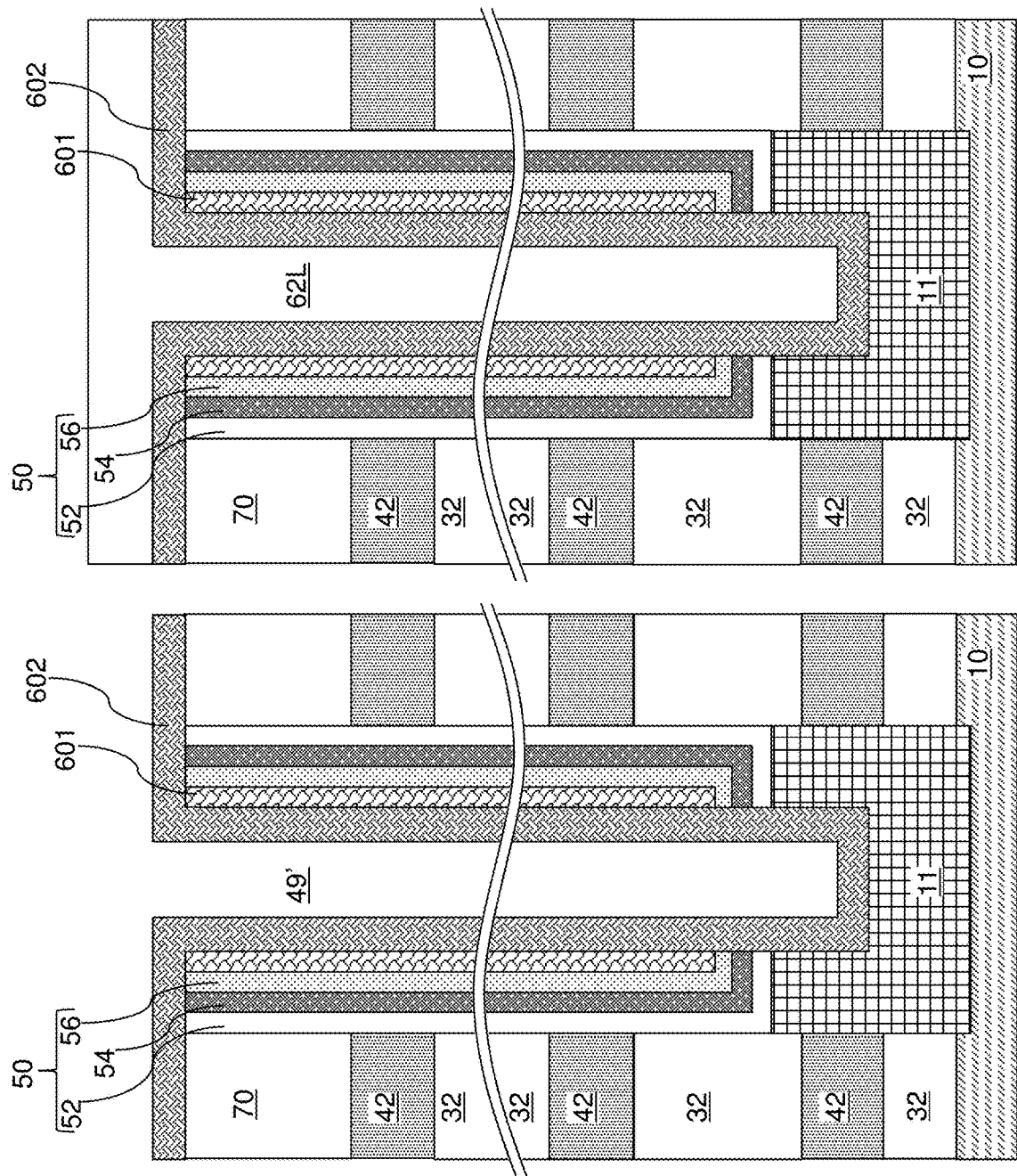

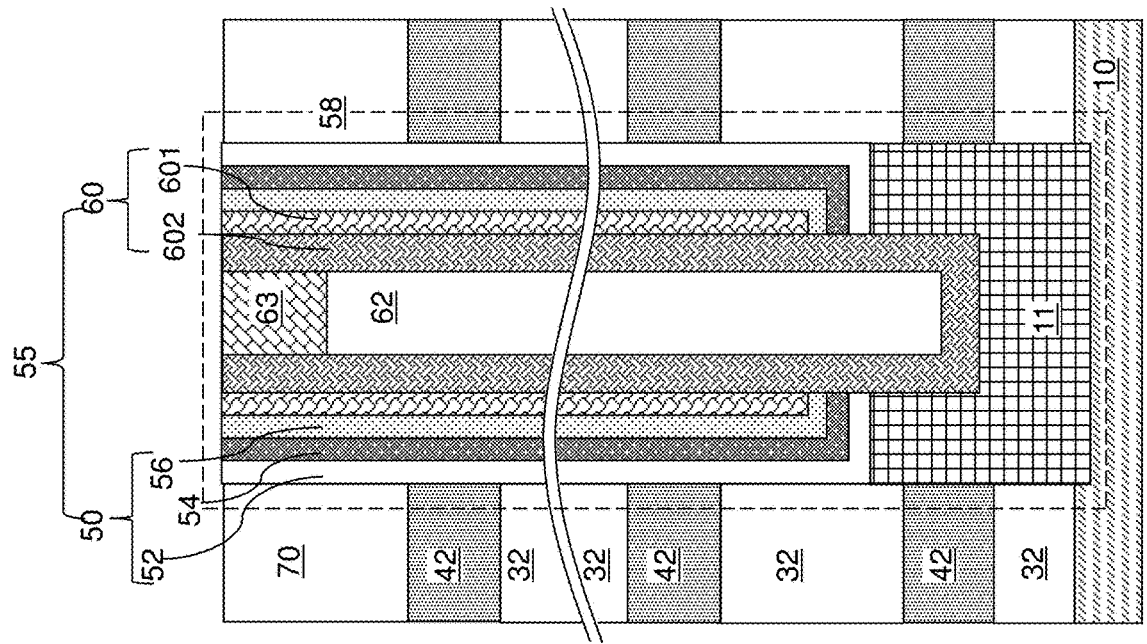
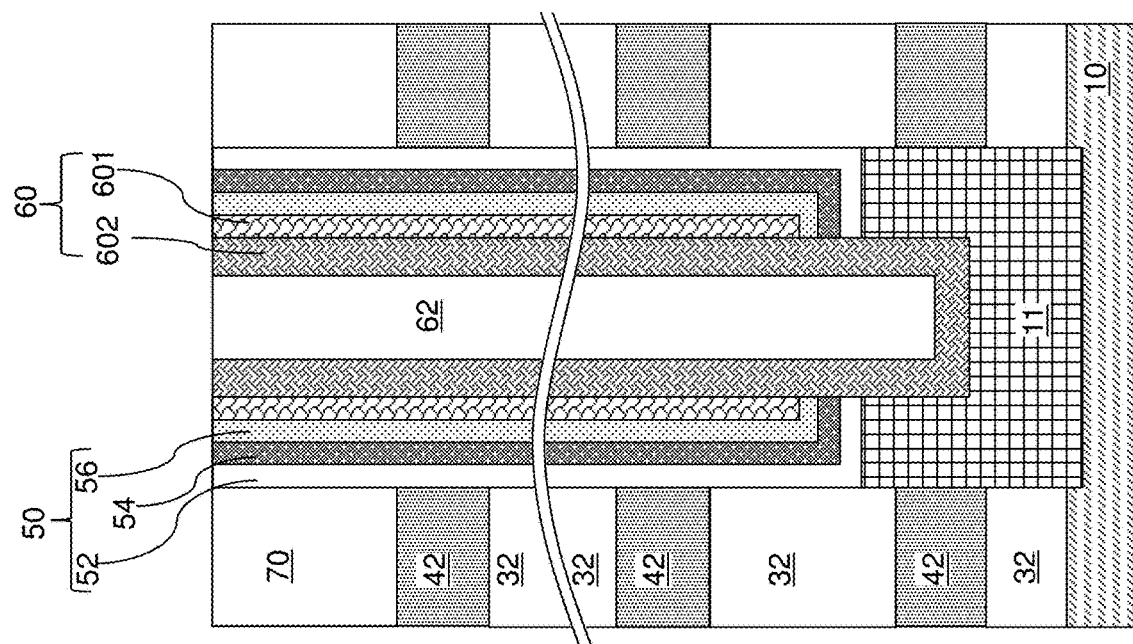

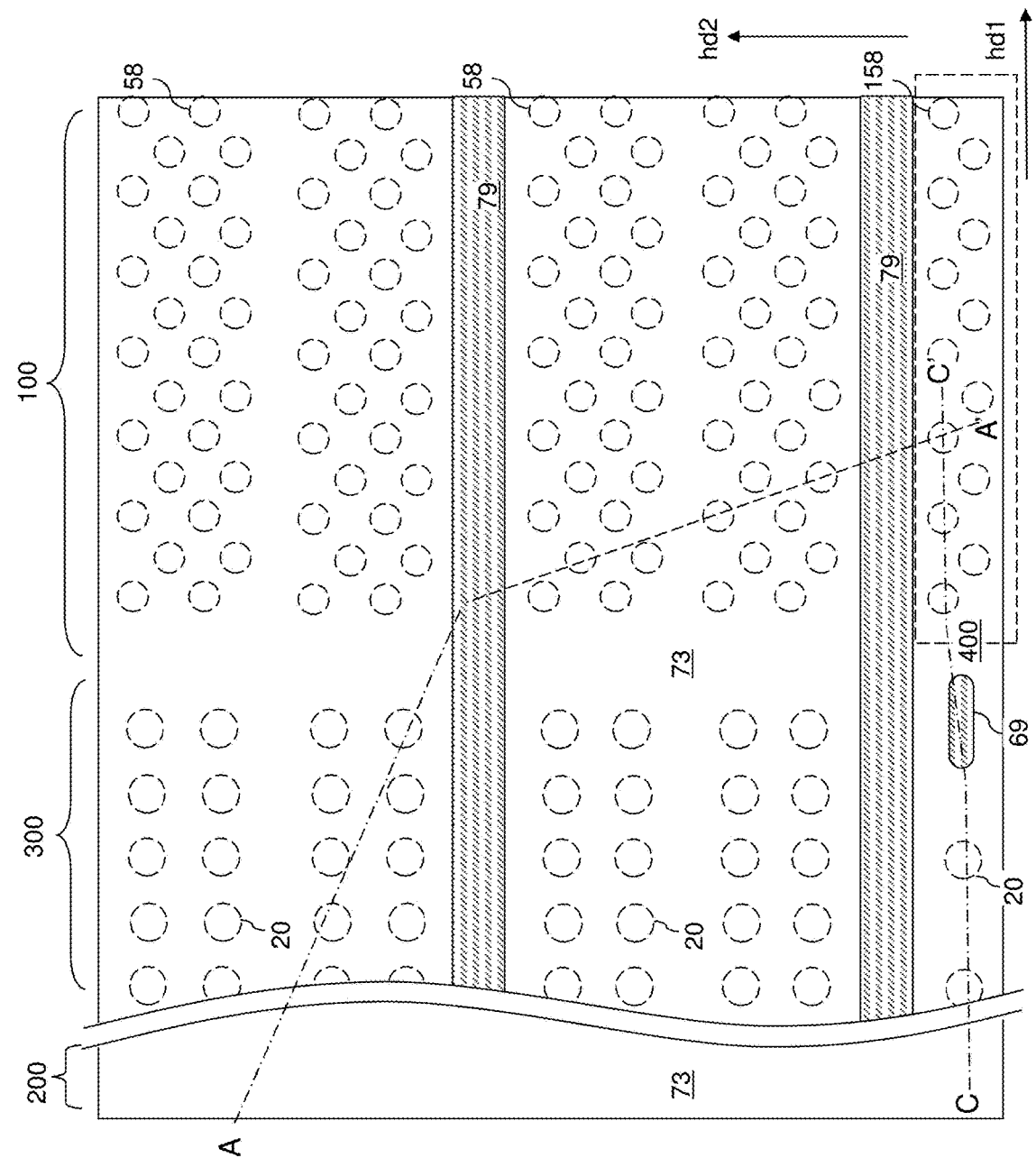

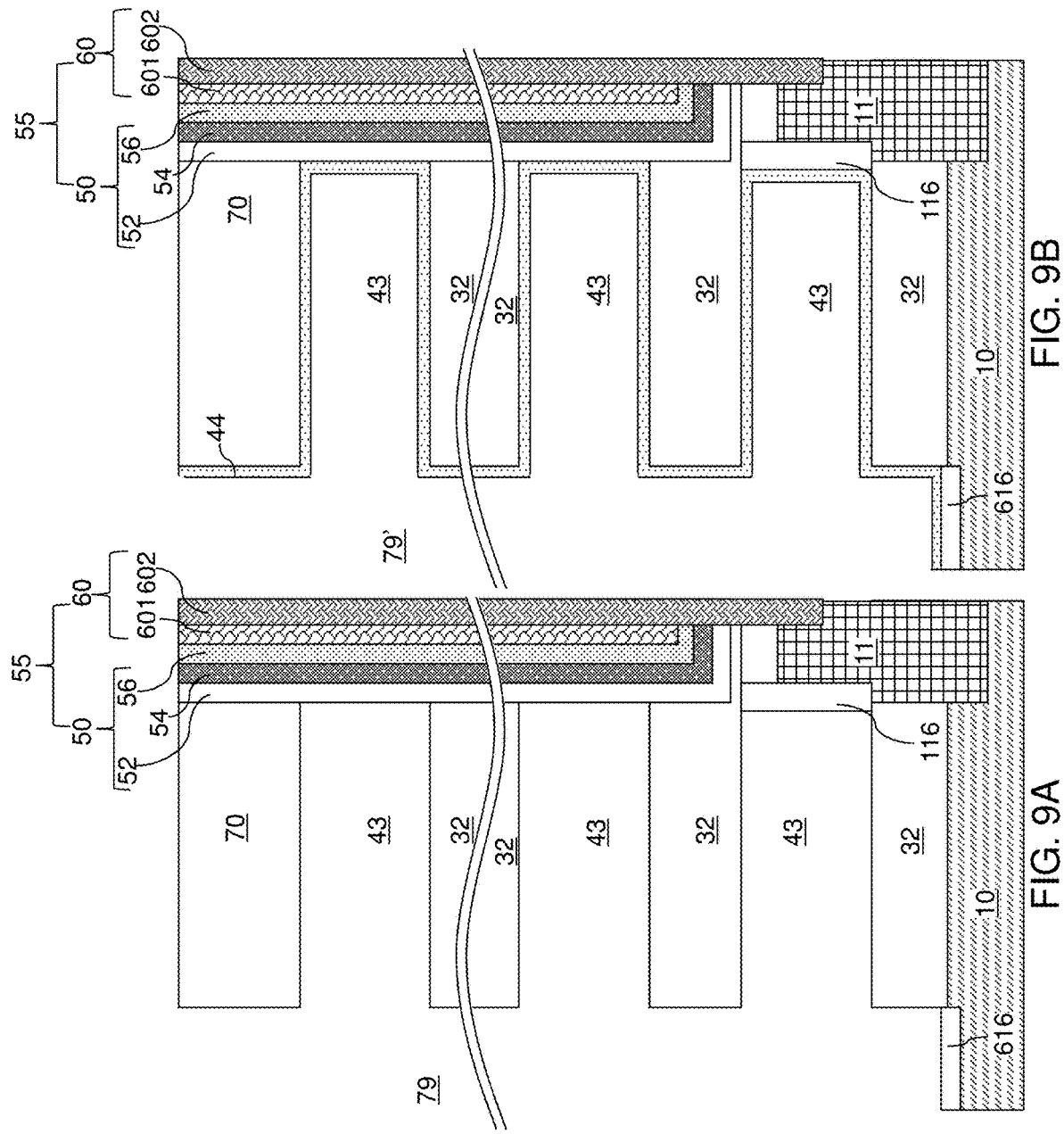

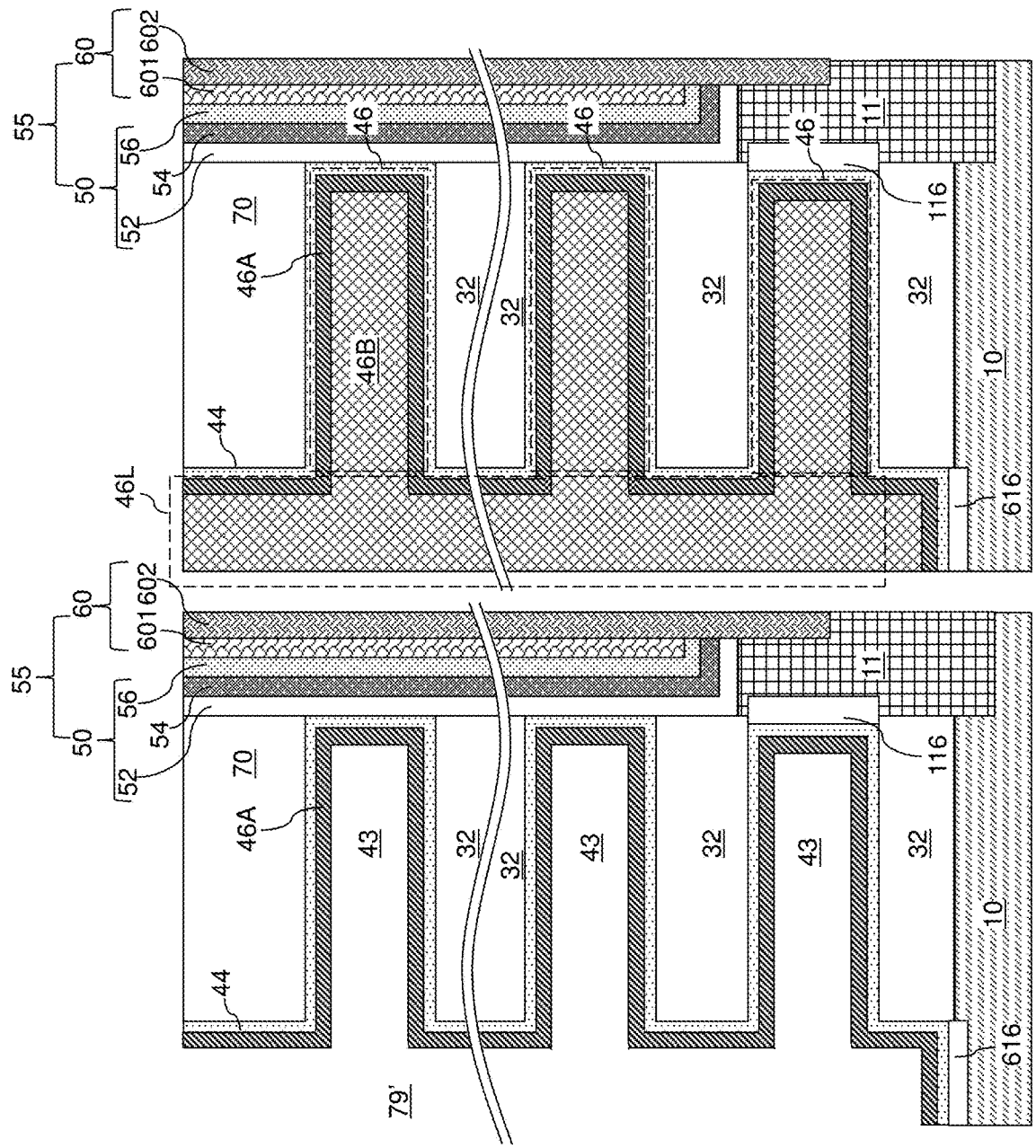

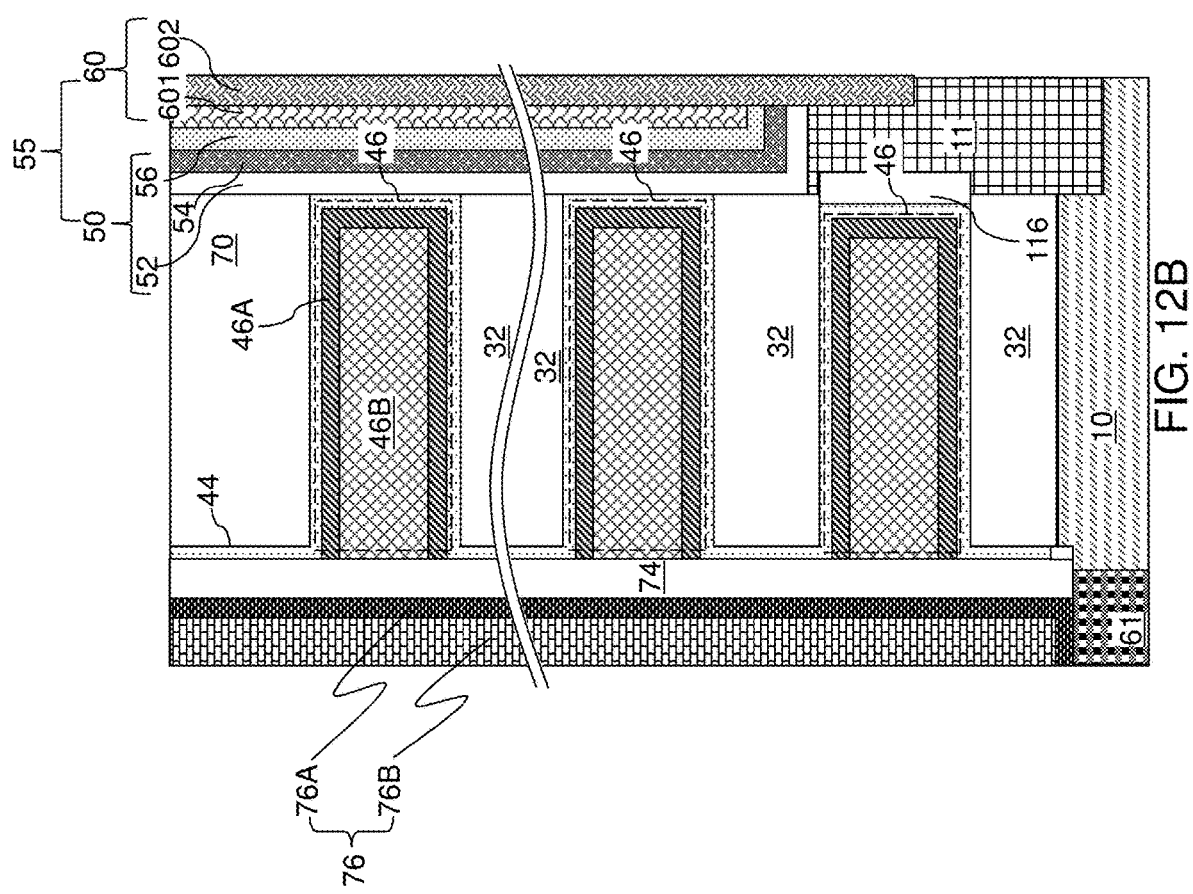

US 10,622,367 B1

THREE-DIMENSIONAL MEMORY DEVICE INCLUDING THREE-DIMENSIONAL BIT LINE DISCHARGE TRANSISTORS AND METHOD OF MAKING THE SAME

FIELD

The present disclosure relates generally to the field of semiconductor devices, and particular to a three-dimensional memory device employing three-dimensional bit line discharge transistors and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36. The charge states of a group of memory cells at each selected word-line-level is read by discharging (which is also referred to as "precharging") the bit lines, providing suitable electrical biases to the bit lines such that the voltage at each bit line is determined by the charge states of the group of memory cells at the selected word-line-level, and sensing the voltages at the bit lines. A significant fraction of the total sense time is determined by the discharge time, i.e., the time it takes to reset the charge states of the bit lines by draining residual electrical charges generated by a previous sensing cycle. A faster discharge time can accelerate the operation of a three-dimensional memory device employing vertical NAND strings.

SUMMARY

According to an aspect of the present disclosure, a three-dimensional memory device is provided, which comprises: a first alternating stack of first insulating layers and first electrically conductive layers located over a substrate; memory stack structures extending through the first alternating stack, wherein each of the memory stack structures comprises a memory film and a vertical semiconductor channel; first drain regions located on a top end of a respective one of the vertical semiconductor channels; bit lines electrically connected to a respective subset of the first drain regions and overlying the memory stack structures; a second alternating stack of second insulating layers and second electrically conductive layers located over the substrate and laterally spaced from the first alternating stack; and vertical discharge transistors including a respective vertical discharge transistor channel that extends through the second alternating stack, wherein the second electrically conductive layers comprise one or more gate electrodes of the vertical discharge transistors.

According to another aspect of the present disclosure, a method of forming a three-dimensional memory device is provided, which comprises: forming a first alternating stack of first insulating layers and first electrically conductive layers over a substrate, wherein memory stack structures extend through the first alternating stack, and each of the memory stack structures comprises a memory film and a vertical semiconductor channel; forming a second alternating stack of second insulating layers and second electrically conductive layers over the substrate, wherein the second alternating stack is laterally spaced from the first alternating stack, vertical discharge transistors including a respective vertical discharge transistor channel extend through the second alternating stack, and the second electrically conductive layers are electrically connected among one another and constitutes a common gate electrode that concurrently switches the vertical discharge transistors; forming bit lines that are electrically connected to upper ends of a respective subset of the vertical semiconductor channels and a respective subset of the vertical discharge transistor channels.

BRIEF DESCRIPTION OF THE DRAWINGS

FIGS. 5A-5H are sequential schematic vertical cross-sectional views of a memory opening within the exemplary structure during formation of a memory stack structure, an optional dielectric core, and a drain region therein according to an embodiment of the present disclosure.

FIG. 7B is a partial see-through top-down view of the exemplary structure of FIG. 7A. The vertical plane A-A' is the plane of the schematic vertical cross-sectional view of FIG. 7A.

FIGS. 9A-9D are sequential vertical cross-sectional views of a region of the exemplary structure during formation of electrically conductive layers according to an embodiment of the present disclosure.

FIG. 12B is a magnified view of a region of the exemplary structure of FIG. 12A.

DETAILED DESCRIPTION

Figure 1:
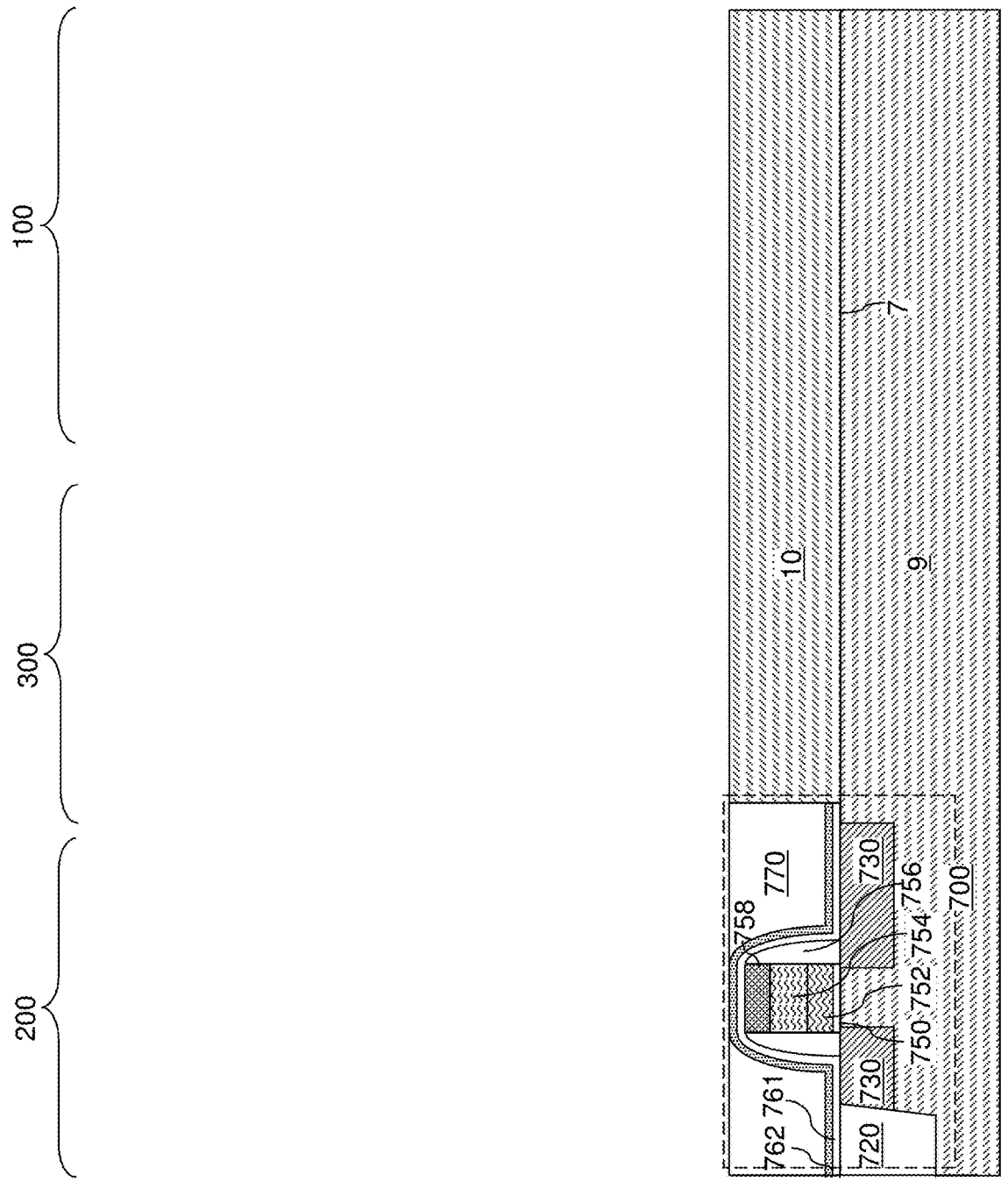
FIG. 1 is a schematic vertical cross-sectional view of an exemplary structure after formation of at least one peripheral device and a semiconductor material layer according to an embodiment of the present disclosure.

As discussed above, the present disclosure is directed to a three-dimensional memory device employing three-dimensional bit line discharge transistors and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

Figure 2:
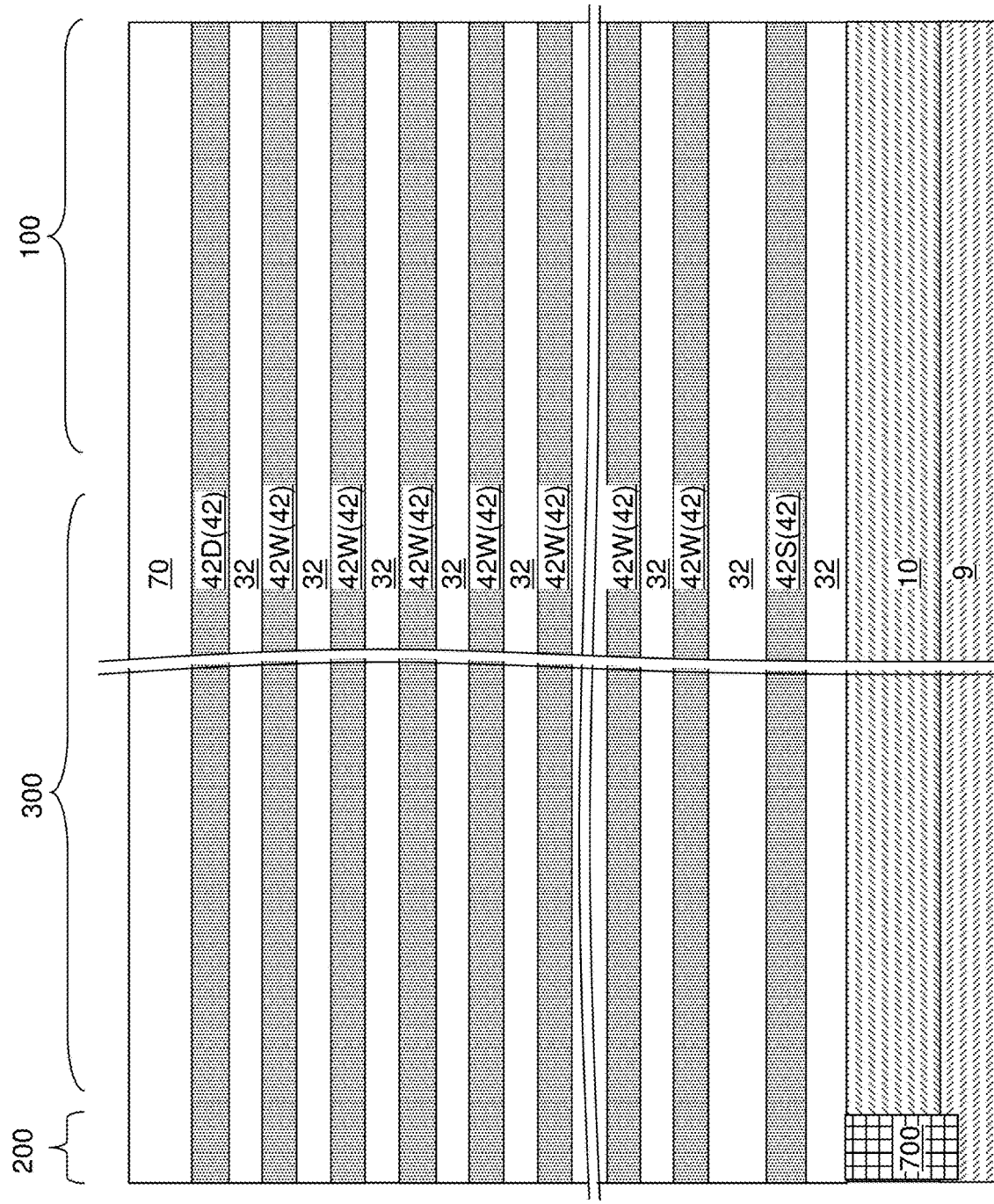
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, by CVD or atomic layer deposition (ALD).

The sacrificial material layers 42 can include a source-select-level sacrificial material layer 42S which is subsequently replaced with a source-select-level electrically conductive layer (i.e., source select gate electrode) configured to select memory stack structure (e.g., a NAND string), word-line-level sacrificial material layers 42W which are subsequently replaced with word-line-level electrically conductive layers (i.e., word lines which function as control gate electrodes for NAND memory cells), and at least one drain-select-level sacrificial material layer 42D which is subsequently replaced with at least one drain-select-level electrically conductive layer (i.e., drain select gate electrode) configured to a memory stack structure (e.g., the NAND string) in a memory array.

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
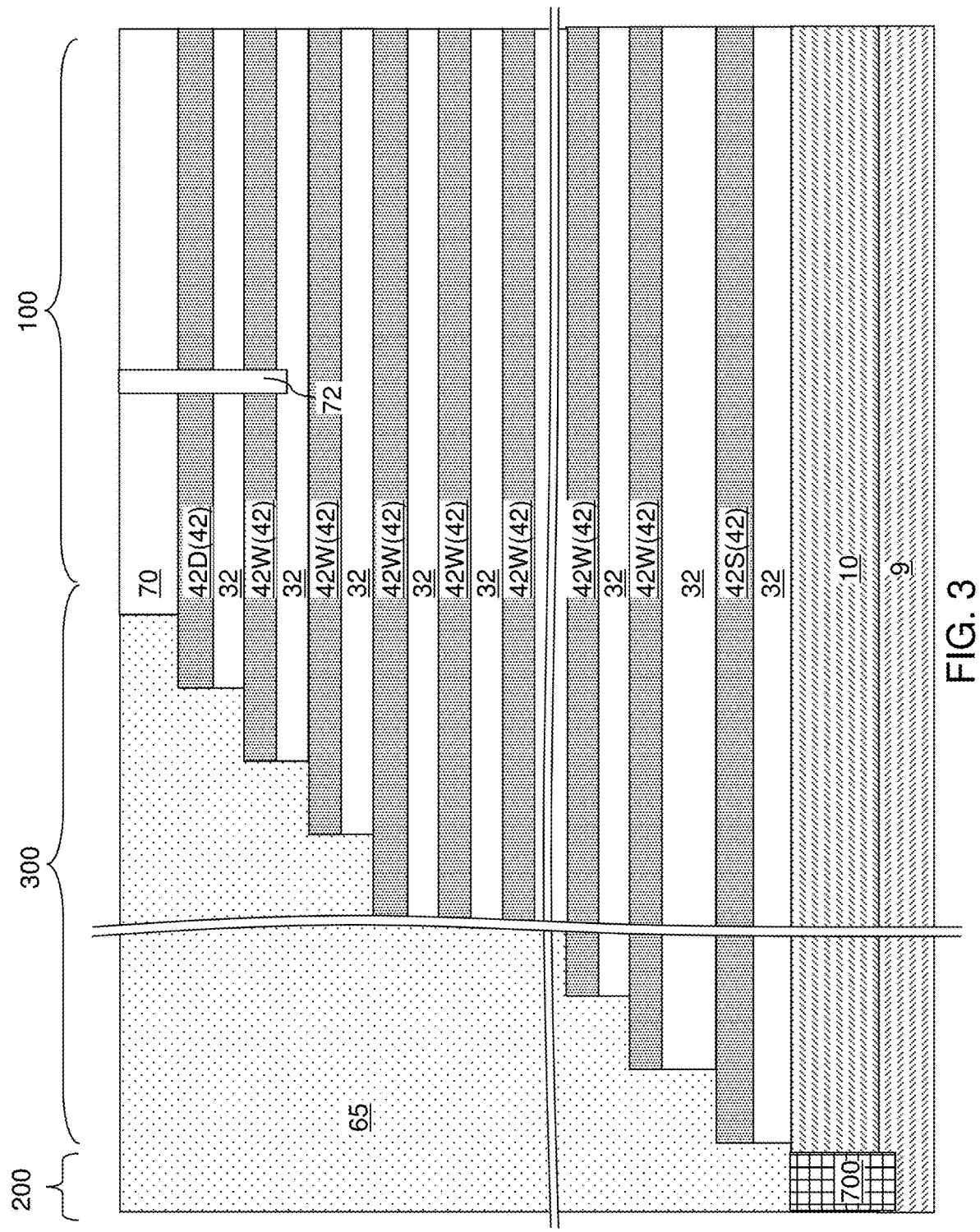
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
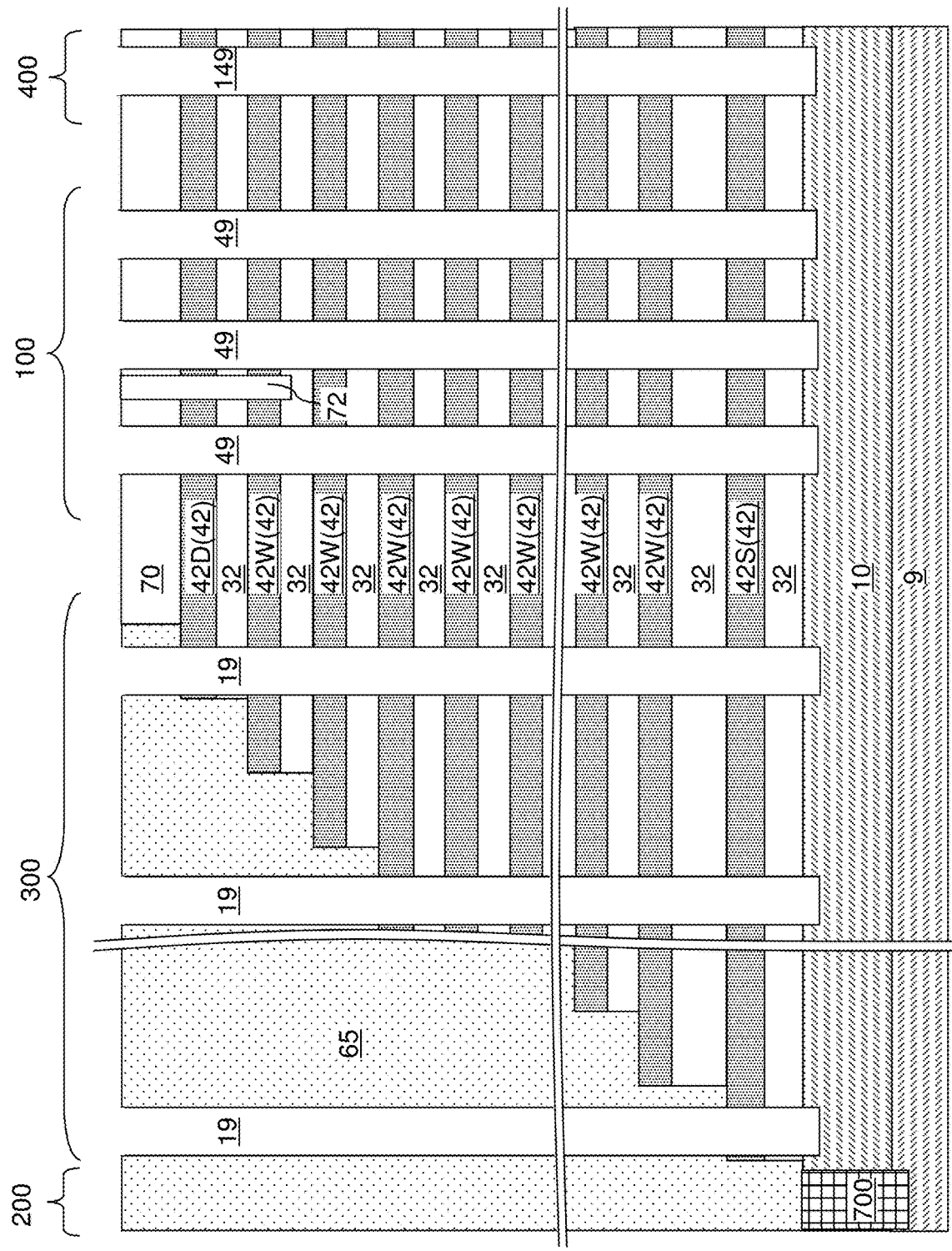
FIG. 4A is a schematic vertical cross-sectional view of the exemplary structure after formation of memory openings, discharge transistor openings, and support openings according to an embodiment of the present disclosure.

FIG. 4A is a schematic vertical cross-sectional view of the exemplary structure after formation of memory openings, discharge transistor openings, and support openings according to an embodiment of the present disclosure.

Figure 4B:
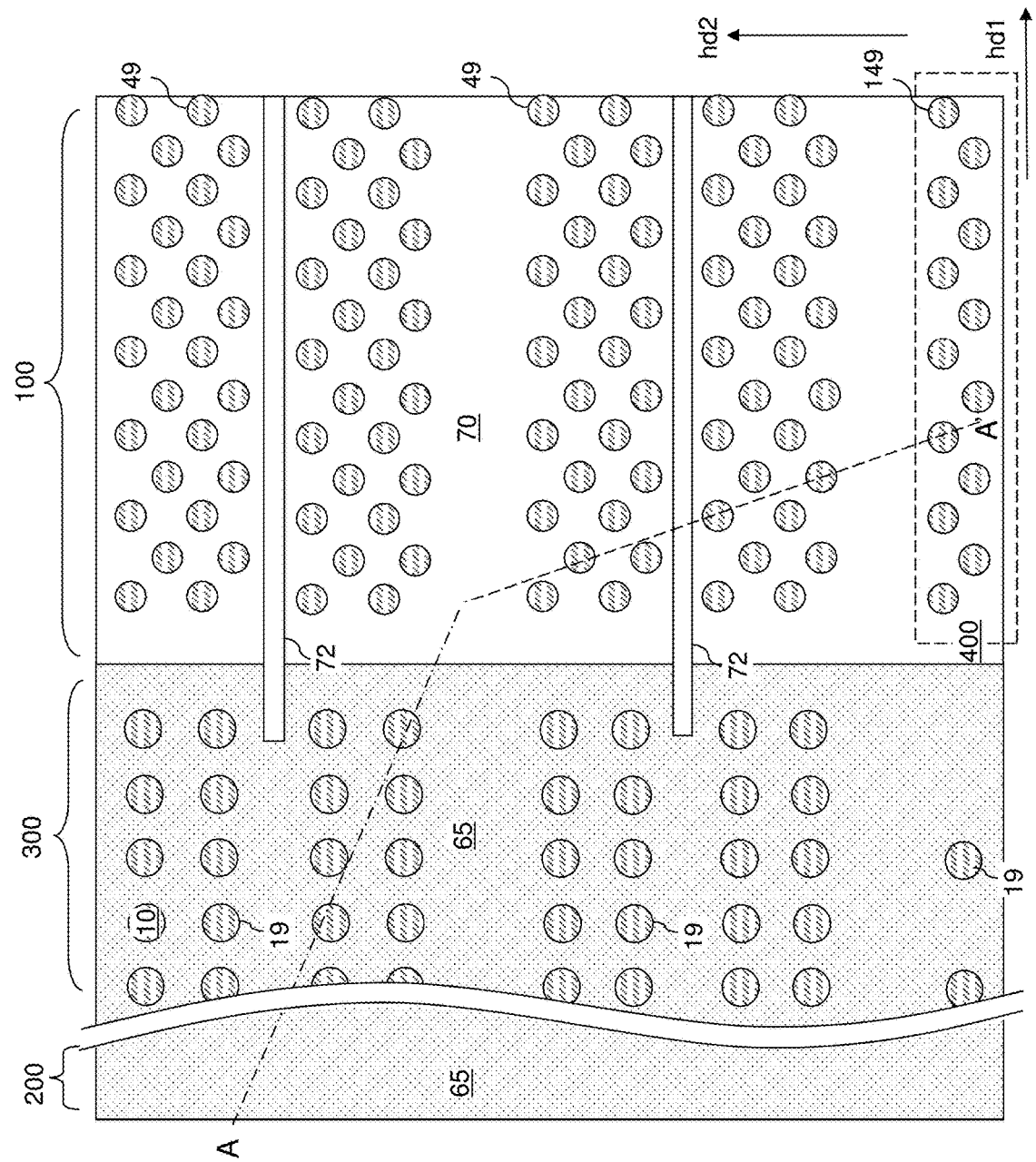
FIG. 4B is a top-down view of the exemplary structure of FIG. 4A. The vertical plane A-A' is the plane of the cross-section for FIG. 4A.

FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100, a second set of openings formed over the contact region 300, and a third set of openings formed over a discharge transistor region 400. The discharge transistor region 400 can be in a strip shape and can be located between neighboring pairs of memory array regions 100 which comprise memory block regions containing a plurality of memory blocks, such as 100 to 500 memory blocks, including 200 to 300 memory blocks each. While only a single memory array region 100 is illustrated in FIGS. 4A and 4B, it is understood that multiple memory array regions 100 (e.g., 2 to 8, such as 3 to 6 memory array regions) and multiple discharge transistor regions 400 can be employed. Each discharge transistor region 400 can be located either in a memory array region 100 or outside a memory array region 100 near the edge of the memory array region 100. Specifically, each discharge transistor region 400 that is located outside a memory array region 100 can be located in a space between a pair of memory array regions 100 that are laterally spaced apart along the second horizontal direction hd2 (e.g., bit line direction) or at the outer edge of a group of memory array regions 100 (e.g., such as at the outer edge of three memory array regions 100 that comprise a memory plane). Each of the memory array regions 100 can include rows of memory openings 49 extending along the first horizontal direction hd1 (e.g., word line direction). Each of the discharge transistor regions 400 can include rows of discharge transistor openings 149 extending along the first horizontal direction hd1.

The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49, support openings 19, and discharge transistor openings 149. As used herein, a "memory opening" 49 refers to an opening in which a memory element, such as a memory stack structure containing a vertical semiconductor channel and a memory film, is subsequently formed. As used herein, a "support opening" 19 refers to an opening in which a support structure (such as a support pillar structure) that mechanically supports other elements is subsequently formed. As used herein, a "discharge transistor opening" 149 refers to an opening in which a discharge transistor is to be subsequently formed. The discharge transistor is used in operation to discharge a respective bit line. The memory openings 49 and the discharge transistor openings 149 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 and the discharge transistor openings 149 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49, the discharge transistor openings 149, and the support openings 19 can extend at least from the horizontal plane including the top surface of the alternating stack (32, 42) to at least the horizontal plane including the topmost surface of the semiconductor material layer 10. In one embodiment, the memory openings 49, the discharge transistor openings 149, and the support openings 19 can extend from the horizontal plane including the top surface of the insulating cap layer 70 to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49, discharge transistor openings 149, and the support openings 19 may include a sidewall (or a plurality of sidewalls) that extends substantially perpendicular to the topmost surface of the substrate (9, 10). A two-dimensional array of memory openings 49 can be formed in the memory array region 100. In the illustrated embodiment, a two-dimensional array of discharge transistor openings 149 can be formed in the memory array region 100. However, as noted above, in an alternative embodiment, the two-dimensional array of discharge transistor openings 149 can be formed outside the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49, each of the discharge transistor openings 149, and in each of the support openings 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Figures 5C, 5D:
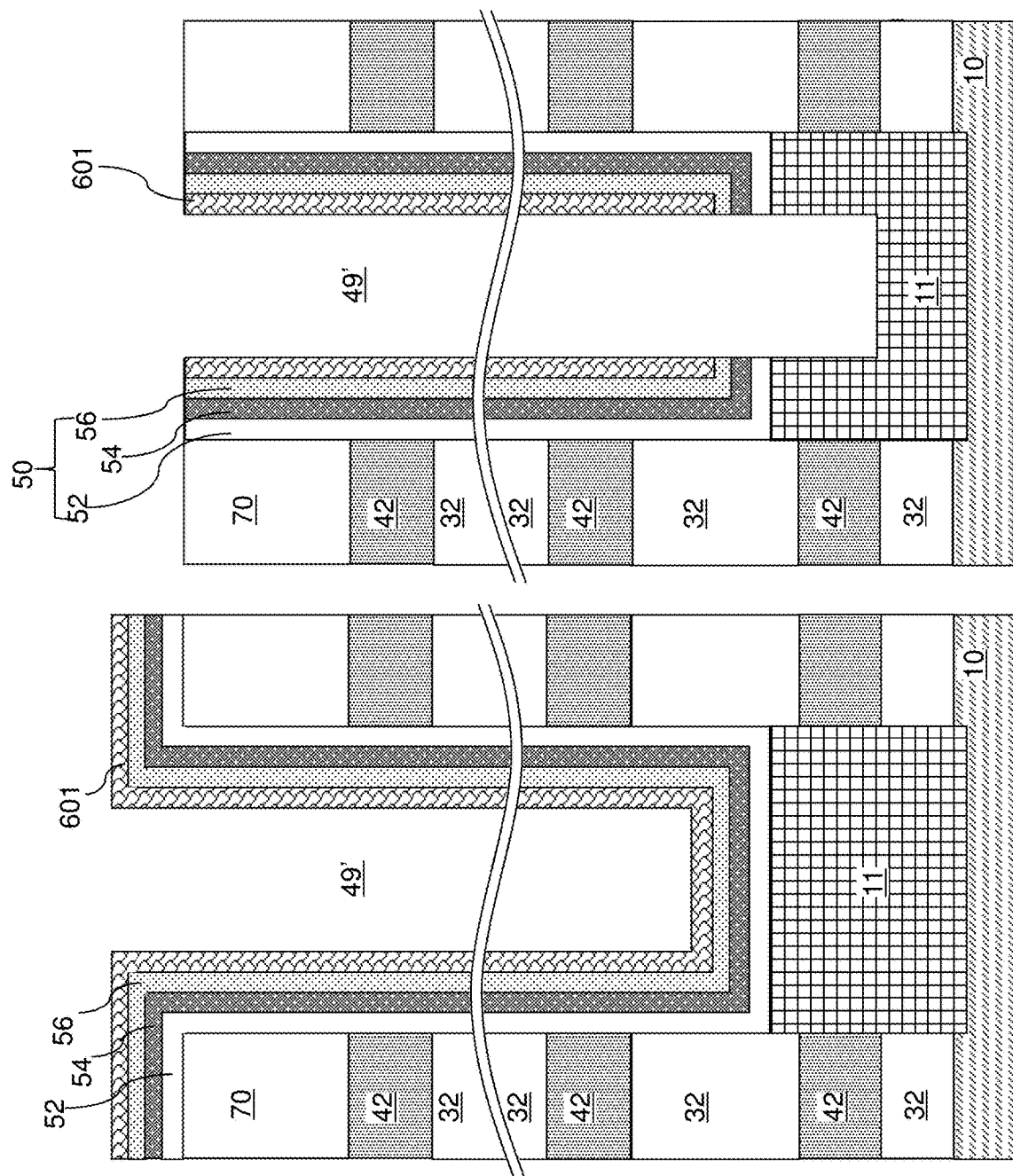

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 5E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 5H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Figure 6:
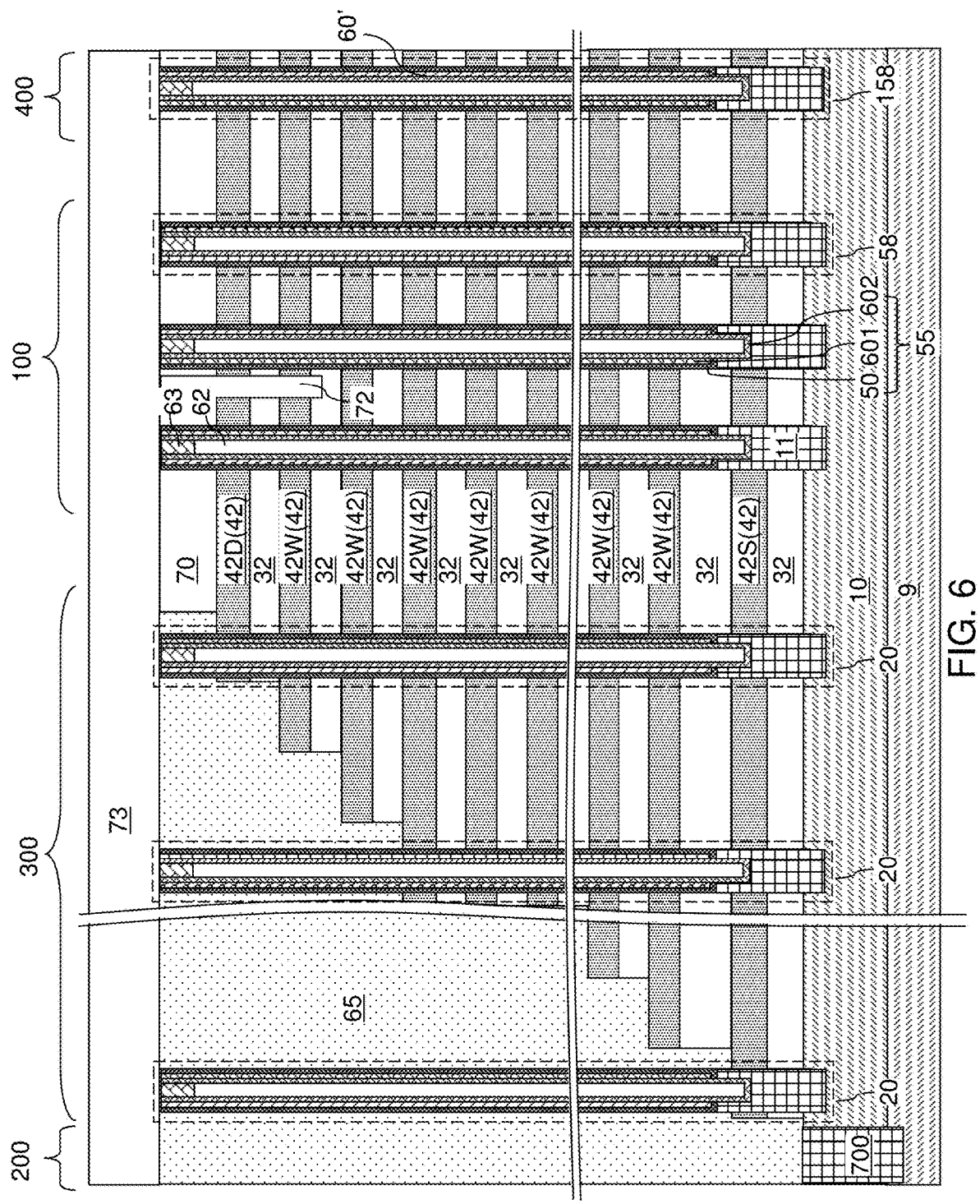
FIG. 6 is a schematic vertical cross-sectional view of the exemplary structure after formation of memory stack structures, discharge transistor pillar structures, and support pillar structures according to an embodiment of the present disclosure.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory stack structure 55, a dielectric core 62, and a drain region 63 within a discharge transistor opening 149 is herein referred to as a discharge transistor pillar structure 158, as shown in FIG. 6. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure 20, as shown in FIG. 6.

Referring to FIG. 6, the exemplary structure is illustrated after formation of memory opening fill structures 58, discharge transistor pillar structures 158, and support pillar structure 20 within the memory openings 49, the discharge transistor openings 149, and the support openings 19, respectively. An instance of a memory opening fill structure 58 can be formed within each memory opening 49 of the structure of FIGS. 4A and 4B. An instance of a discharge transistor pillar structure 158 can be formed within each discharge transistor opening 149 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

The memory film 50 of each discharge transistor pillar structure 158 constitutes a gate dielectric of a vertical discharge transistor that includes the discharge transistor pillar structure 158. The vertical semiconductor channel 60 of each discharge transistor pillar structure 60 constitutes a transistor channel of the vertical discharge transistor, which is herein referred to as a vertical discharge transistor channel 60'. Thus, each of the vertical semiconductor channels 60 of the memory opening fill structures 58 and each of the vertical discharge transistor channels 60' of the vertical discharge transistors can have the same doped semiconductor material having the same dopant concentration.

Figure 7A:
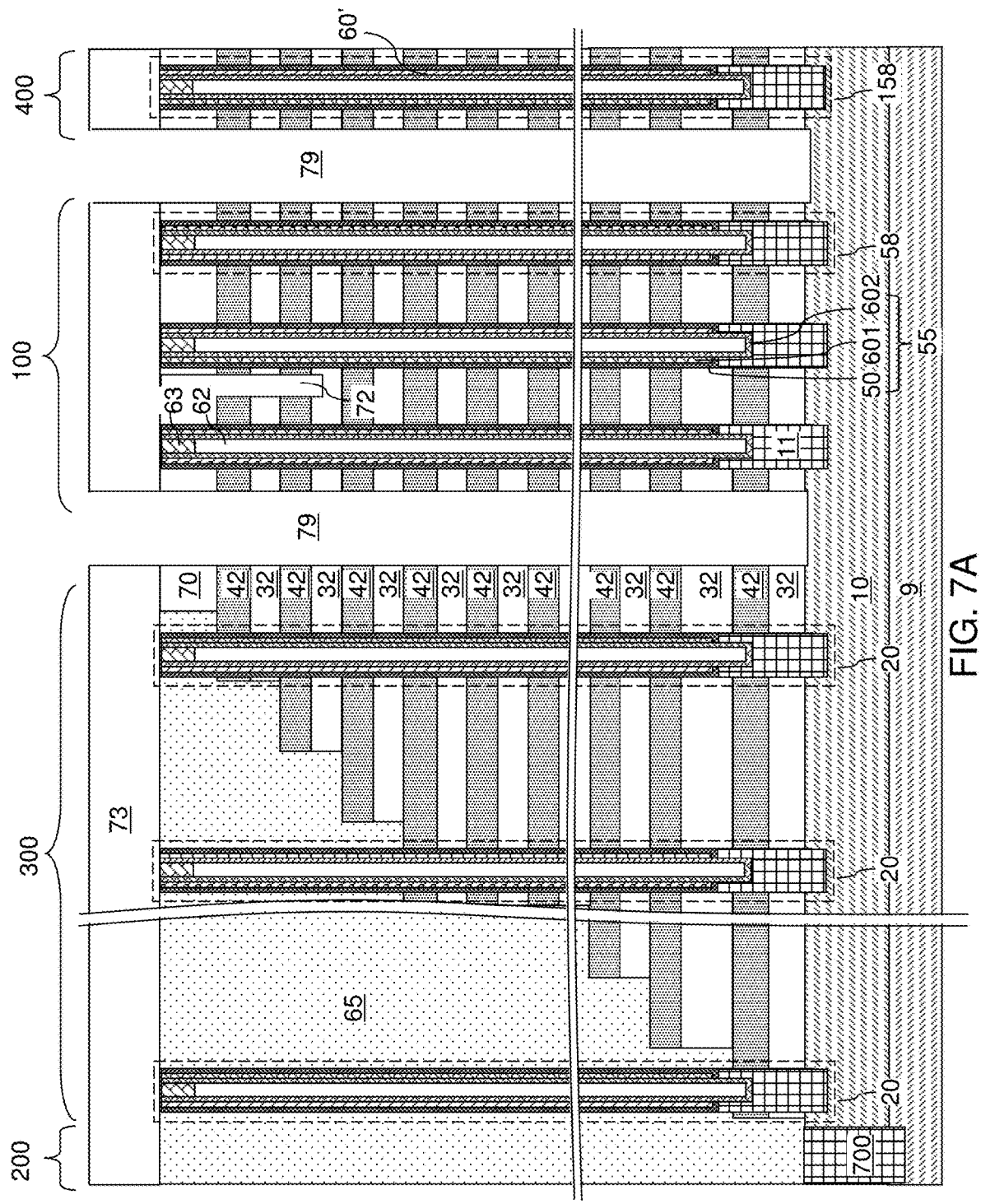
FIG. 7A is a schematic vertical cross-sectional view of the exemplary structure after formation of backside trenches according to an embodiment of the present disclosure.
Figure 7C:
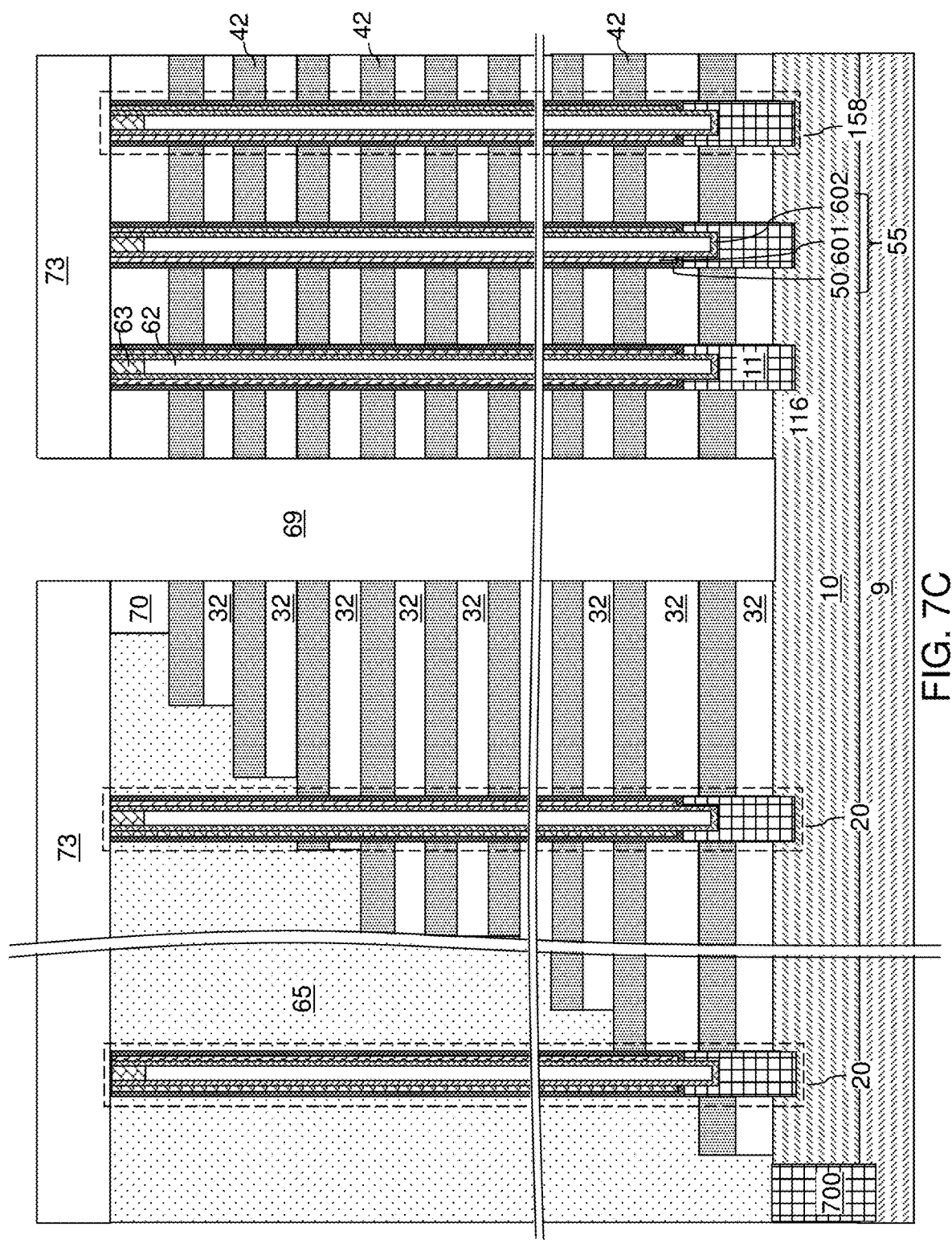
FIG. 7C is a schematic vertical cross-sectional view of the exemplary structure along the vertical plane C-C' of FIG. 7B.

Referring to FIGS. 7A-7C, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55 and between neighboring clusters of memory stack structures 55 and the discharge transistor pillar structures 158. Optionally, additional openings can be formed through each layer of the alternating stack (32, 42) adjacent to clusters of discharge transistor pillar structures 158.

The pattern in the photoresist layer can be transferred through the contact level dielectric layer 73, the alternating stack (32, 42) and/or the retro-stepped dielectric material portion 65 employing an anisotropic etch to form backside trenches 79 and optional backside openings 69. The backside trenches 79 vertically extend from the top surface of the contact level dielectric layer 73 at least to the top surface of the substrate (9, 10), and laterally extend through the memory array region 100 and the contact region 300. The optional backside openings 69 can be formed in portions of the contact region 300 that are proximal to a respective one of the discharge transistor region 400. The backside openings 69 can be omitted in an alternative embodiment that will be described in more detail below, in which the gate electrodes of the discharge transistors are not shorted to each other.

The continuous alternating stack of insulating layers 32 and sacrificial material layers 42 provided at the processing steps of FIG. 6 is divided into first portions of the alternating stack (32, 42) including the memory stack structures 55 and second portions of the alternating stack (32, 42) including the vertical discharge transistor channels 60', i.e., including the discharge transistor pillar structures 158. In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1.

Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. Each patterned portion of the alternating stack (32, 42) can be laterally bounded by a pair of backside trenches 79. Each two-dimensional array of memory stack structures 55 includes columns of memory stack structures 55 that extend along the second horizontal direction hd2. Each column of memory stack structures 55 extend across at least one patterned portion of the alternating stack (32, 42), and may extend across a plurality of patterned portions of the alternating stack (32, 42). Each discharge transistor pillar structure 158 can be aligned to a respective column of memory stack structures 55, i.e., located within a same vertical plane passing through geometrical centers of the memory stack structures 55 within the column of memory stack structures 55. The photoresist layer can be removed, for example, by ashing.

Figure 8:
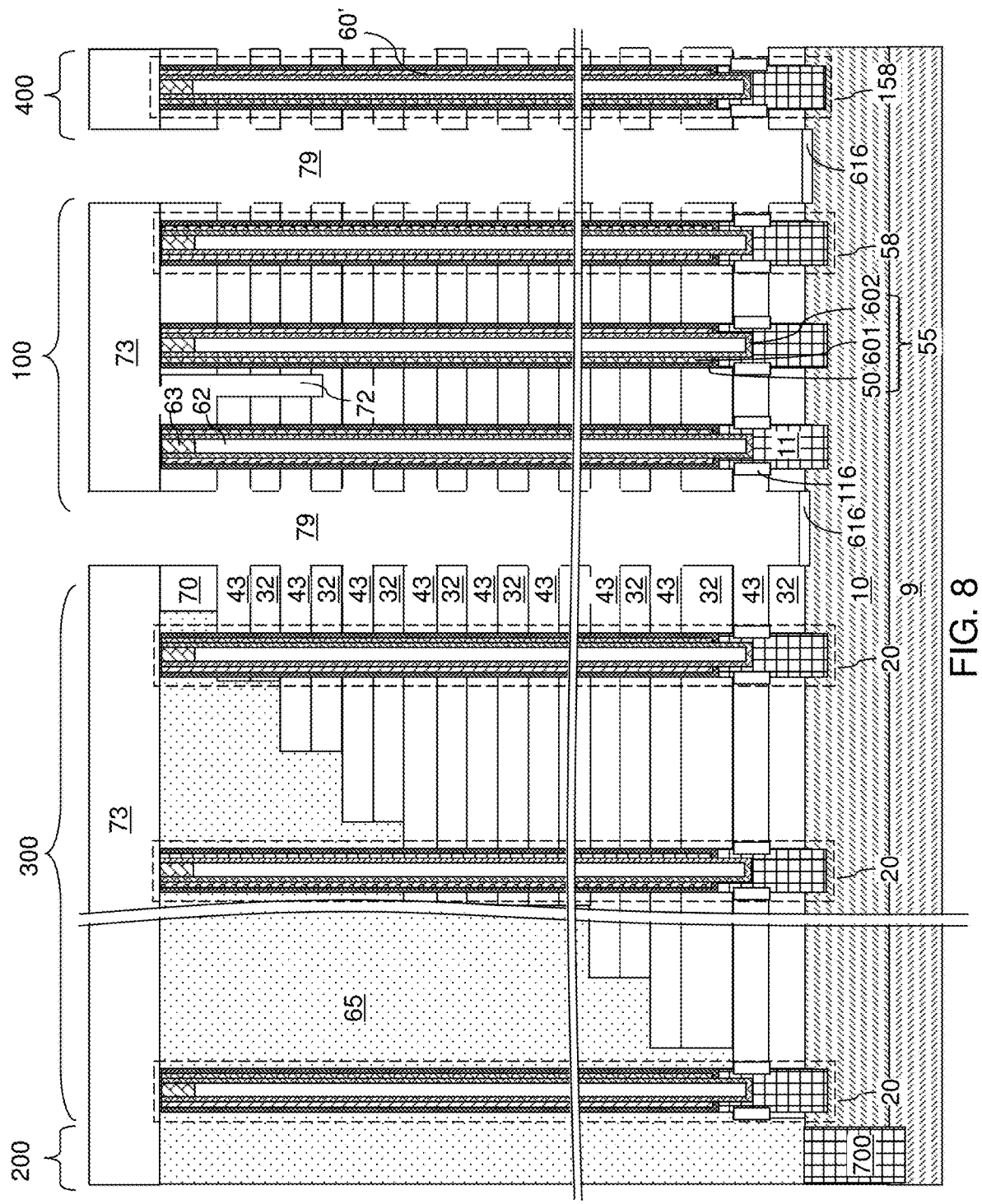
FIG. 8 is a schematic vertical cross-sectional view of the exemplary structure after formation of backside recesses according to an embodiment of the present disclosure.

Referring to FIGS. 8 and 9A, an etchant that selectively etches the second material of the sacrificial material layers 42 with respect to the first material of the insulating layers 32 can be introduced into the backside trenches 79 and the backside openings 69, for example, employing an etch process. FIG. 9A illustrates a region of the exemplary structure of FIG. 8. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 9B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 9C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 10:
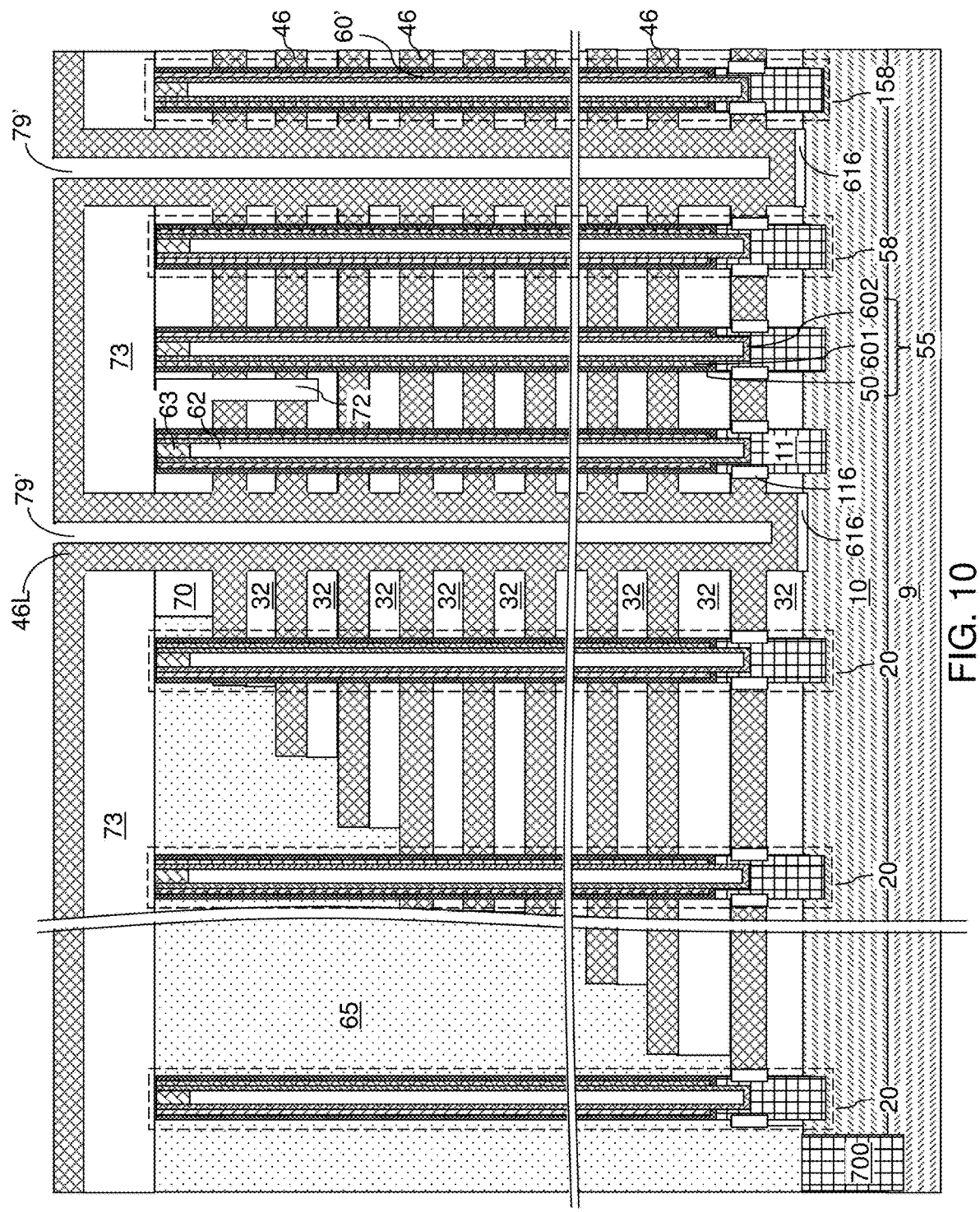
FIG. 10 is a schematic vertical cross-sectional view of the exemplary structure at the processing step of FIG. 9D.
Figure 11A:
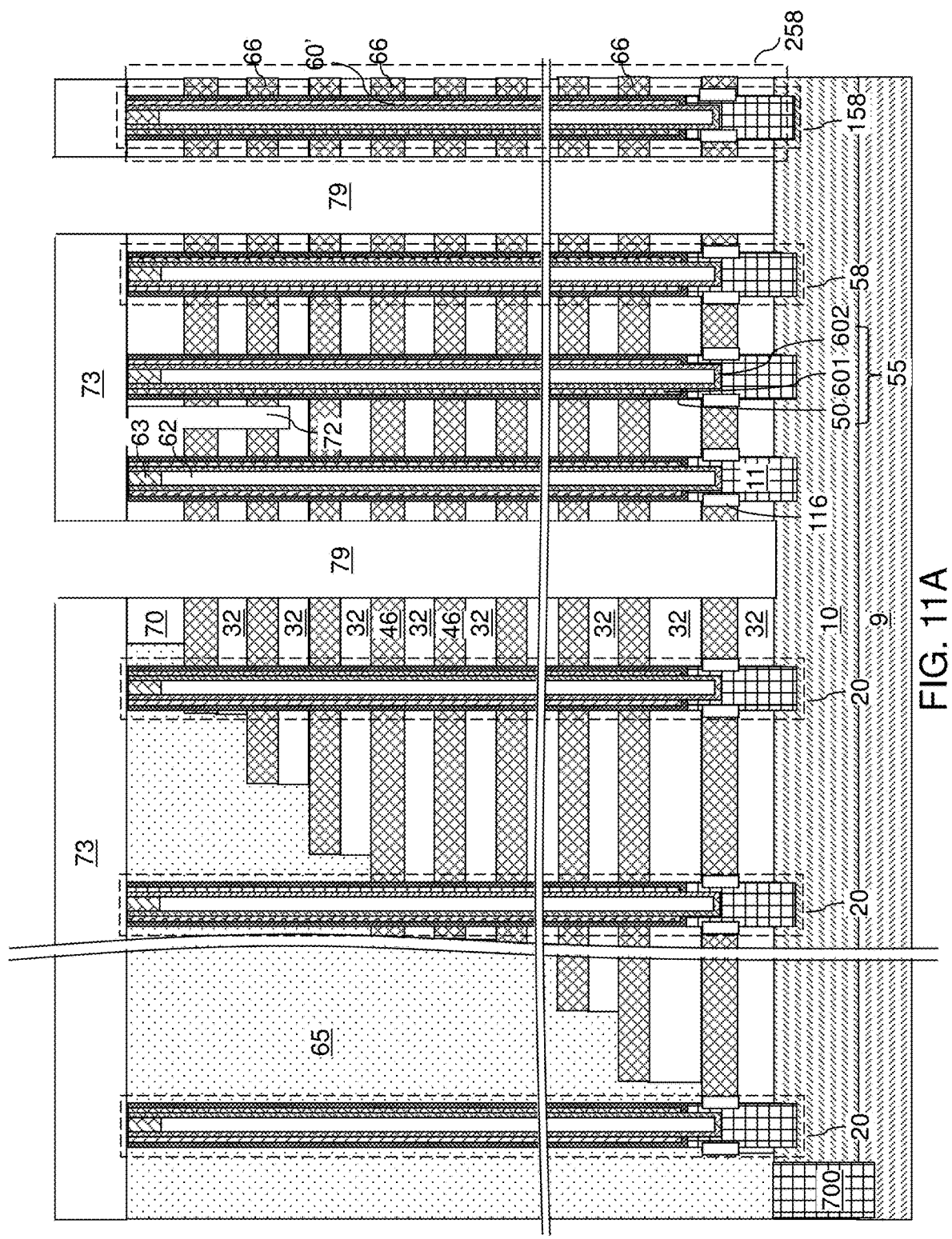
FIG. 11A is a schematic vertical cross-sectional view of the exemplary structure after removal of a deposited conductive material from within the backside trench according to an embodiment of the present disclosure.
Figure 11B:
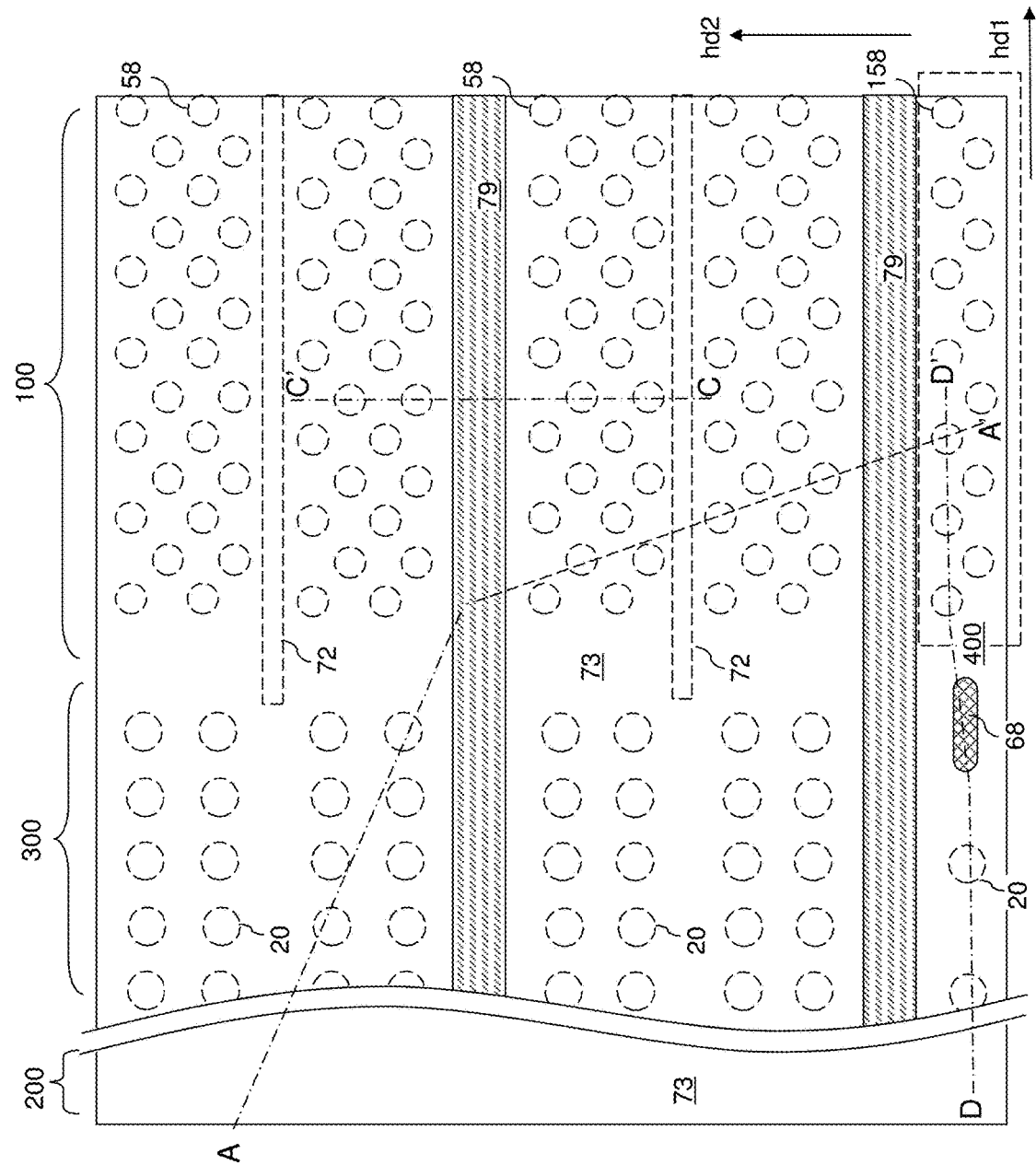
FIG. 11B is a partial see-through top-down view of the exemplary structure of FIG. 11A. The vertical plane A-A' is the plane of the schematic vertical cross-sectional view of FIG. 11A.
Figure 11C:
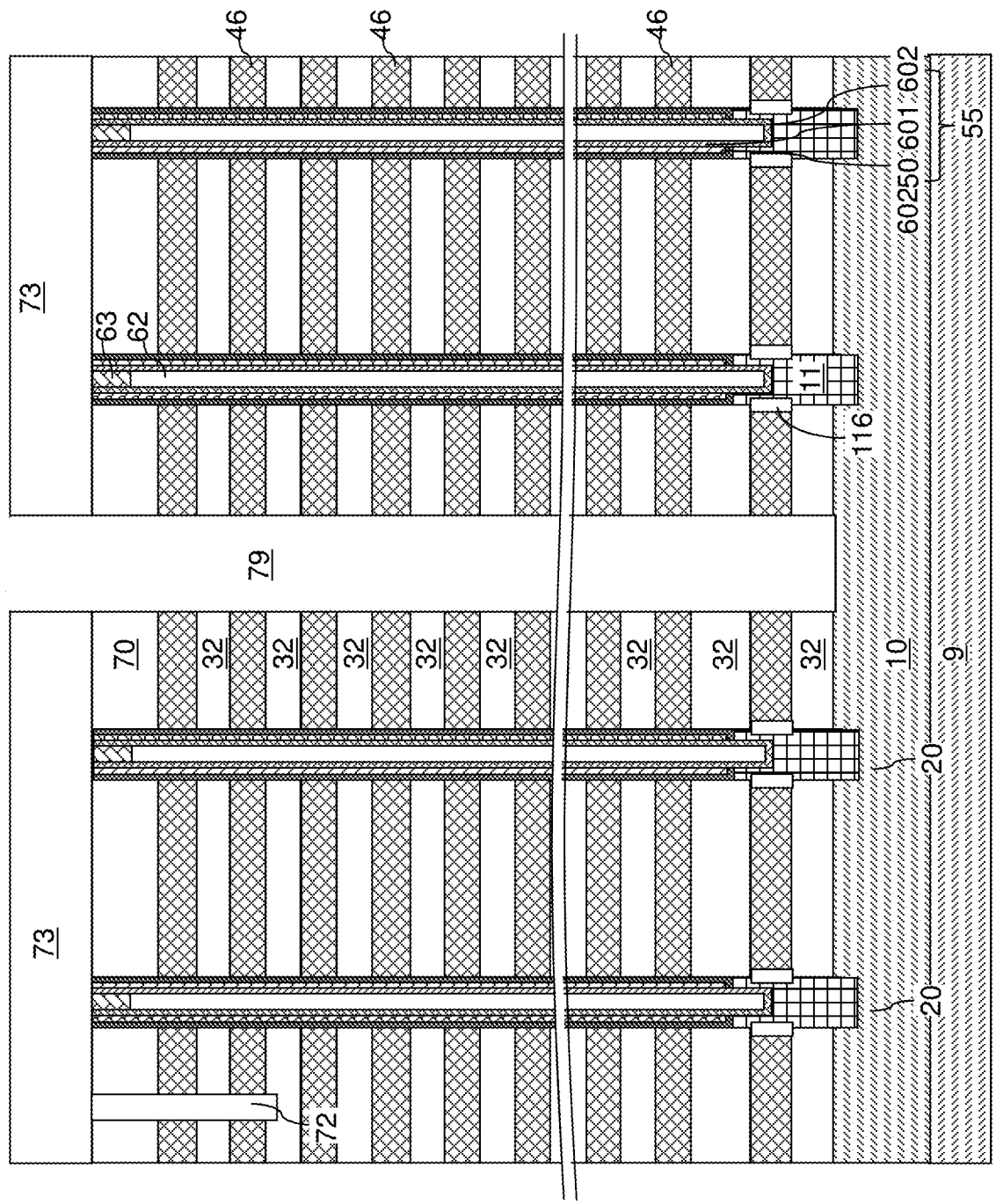
FIG. 11C is a schematic vertical cross-sectional view of the exemplary structure along the vertical plane C-C' of FIG. 11B.
Figure 11D:
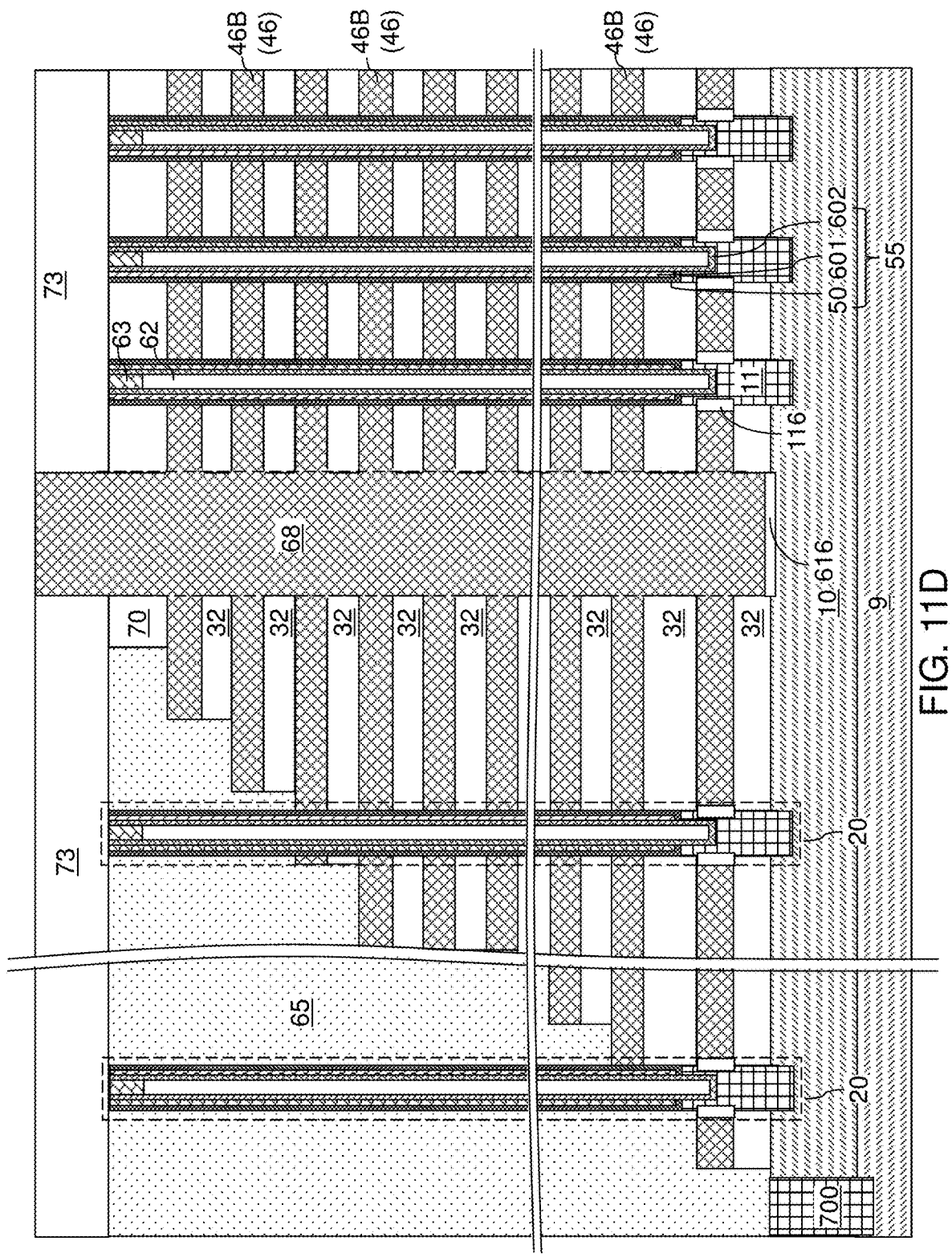
FIG. 11D is a schematic vertical cross-sectional view of the exemplary structure along the vertical plane D-D' of FIG. 11B.

Referring to FIGS. 9D and 10, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact level dielectric layer 73. Each backside opening 69 can have a minimum lateral dimension that is less than twice the thickness of the deposited conductive material, and thus, is completely filled with the at least one conductive material.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Referring to FIGS. 11A-11D, the deposited metallic material of the continuous electrically conductive material layer 46L is etched back from the sidewalls of each backside trench 79 and from above the contact level dielectric layer 73, for example, by an isotropic wet etch process. Each remaining portion of the deposited metallic material in the backside recesses 43 constitutes an electrically conductive layer (46, 66). Each electrically conductive layer 46 can be a conductive line structure. Thus, the sacrificial material layers 42 are replaced with the electrically conductive layers (46, 66). If the optional backside openings 69 are present, then deposited metallic material fills each of the backside openings 69, and forms optional conductive via structures 68, which are also referred to discharge transistor gate interconnection via structure.

Thus, remaining portions of the continuous sacrificial material layers 42 after formation of the backside trenches 79 and the backside openings 69 are replaced with electrically conductive layers 46 including the at least one electrically conductive material. First alternating stacks of insulating layers 32 and first electrically conductive layers 46 are formed within the memory array regions 100. Second alternating stacks of insulating layers 32 and second electrically conductive layers 66 are formed within the discharge transistor regions 400.

Each first electrically conductive layer 46 in the memory array regions 100 can function as a combination of a plurality of select gate electrodes and control gate electrodes located at a same level and a word line electrically interconnecting, i.e., electrically shorting, the plurality of select and control gate electrodes located at the same level. The plurality of control gate electrodes within each first electrically conductive layer 46 in the memory array regions 100 are either the select gate electrodes or the control gate electrodes for the vertical memory devices including the memory stack structures 55. In other words, each first electrically conductive layer 46 in the memory array regions 100 can be a word line that functions as a common select or control gate electrode for the plurality of vertical memory devices. The planar dielectric portions 616 can be removed during removal of the continuous electrically conductive material layer 46L. A backside cavity 79' is present within each backside trench 79.

Generally, first alternating stacks (32, 46) of first insulating layers 32 and first electrically conductive layers 46 are formed over the substrate (9, 10) in the memory array regions 100. Memory stack structures 55 extend through the first alternating stacks (32, 46), and each of the memory stack structures comprises a memory film 50 and a vertical semiconductor channel 60. Second alternating stacks (32, 66) of second insulating layers 32 and second electrically conductive layers 66 are formed over the substrate (9, 10) in the discharge transistor regions 400. Each second alternating stack (32, 66) is laterally spaced from the first alternating stacks (32, 76). Vertical discharge transistors 258 including a respective vertical discharge transistor channel 60' extend through each second alternating stack (32, 66). The second electrically conductive layers 66 are electrically connected to each other by the vertical contact via structure 68 which contacts a side edge of each of the second electrically conductive layers 66. The second electrically conductive layers 66 and the vertical contact via structure 68 constitute a common gate electrode (66, 68) that concurrently switches the vertical discharge transistors. The vertical discharge transistors 258 include portions of the common gate electrode (66, 68) and the discharge transistor pillar structures 158 comprising the discharge transistor channel 60' and gate dielectric 50.

Figure 12A:
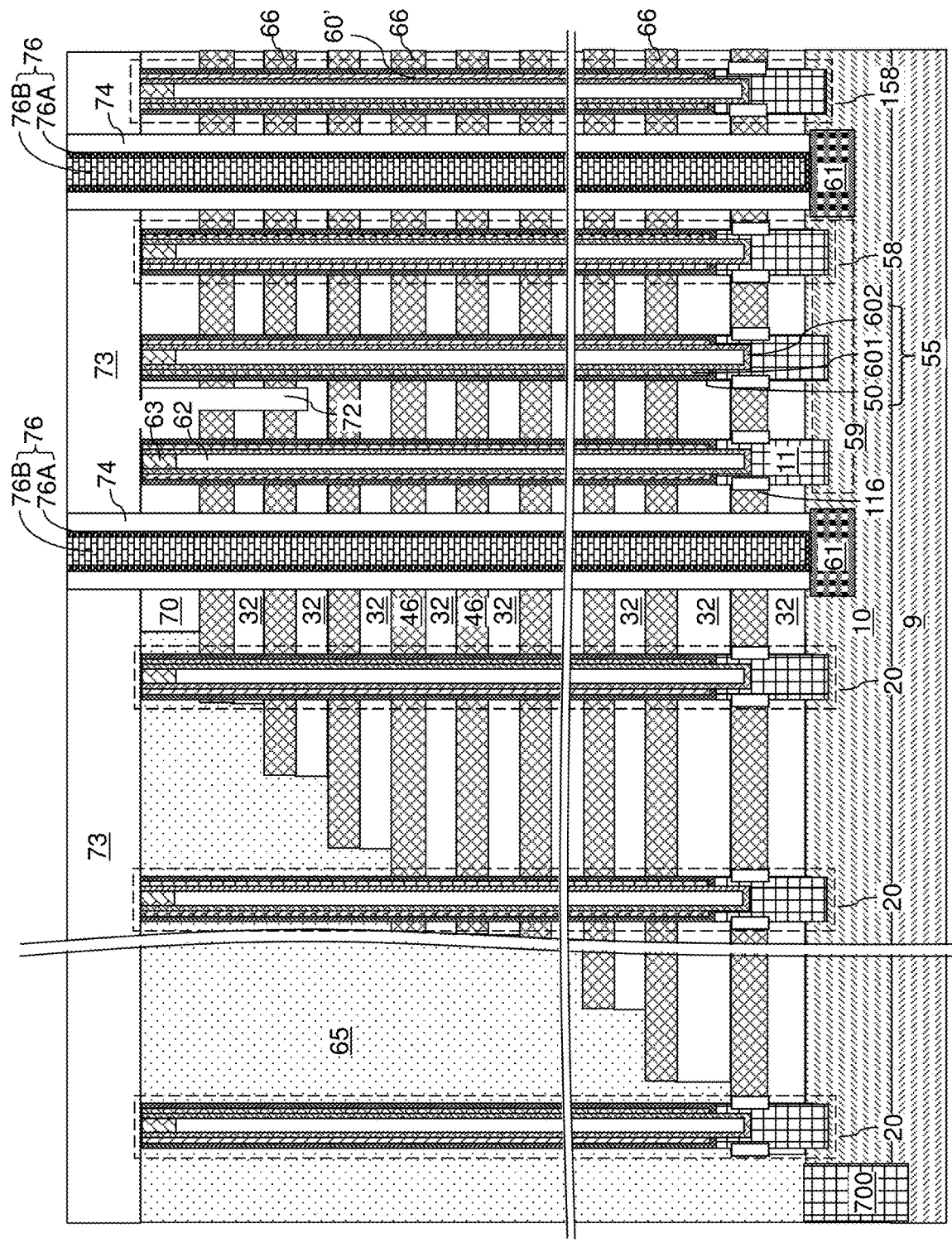
FIG. 12A is a schematic vertical cross-sectional view of the exemplary structure after formation of insulating spacers and backside contact structures according to an embodiment of the present disclosure.

Referring to FIGS. 12A and 12B, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the contact level dielectric layer 73 and at the bottom of each backside trench 79. Each remaining portion of the insulating material layer constitutes an insulating spacer 74, which is a dielectric wall structure that laterally extends along the first horizontal direction hd1. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels {60' or (59, 11, 60)} extend between each source region 61 and a respective set of drain regions 63. The semiconductor channels {60' or (59, 11, 60)} include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the first alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76. The backside contact via structure 76 extends through the first alternating stack (32, 46), and contacts a top surface of the source region 61.

Figure 13A:
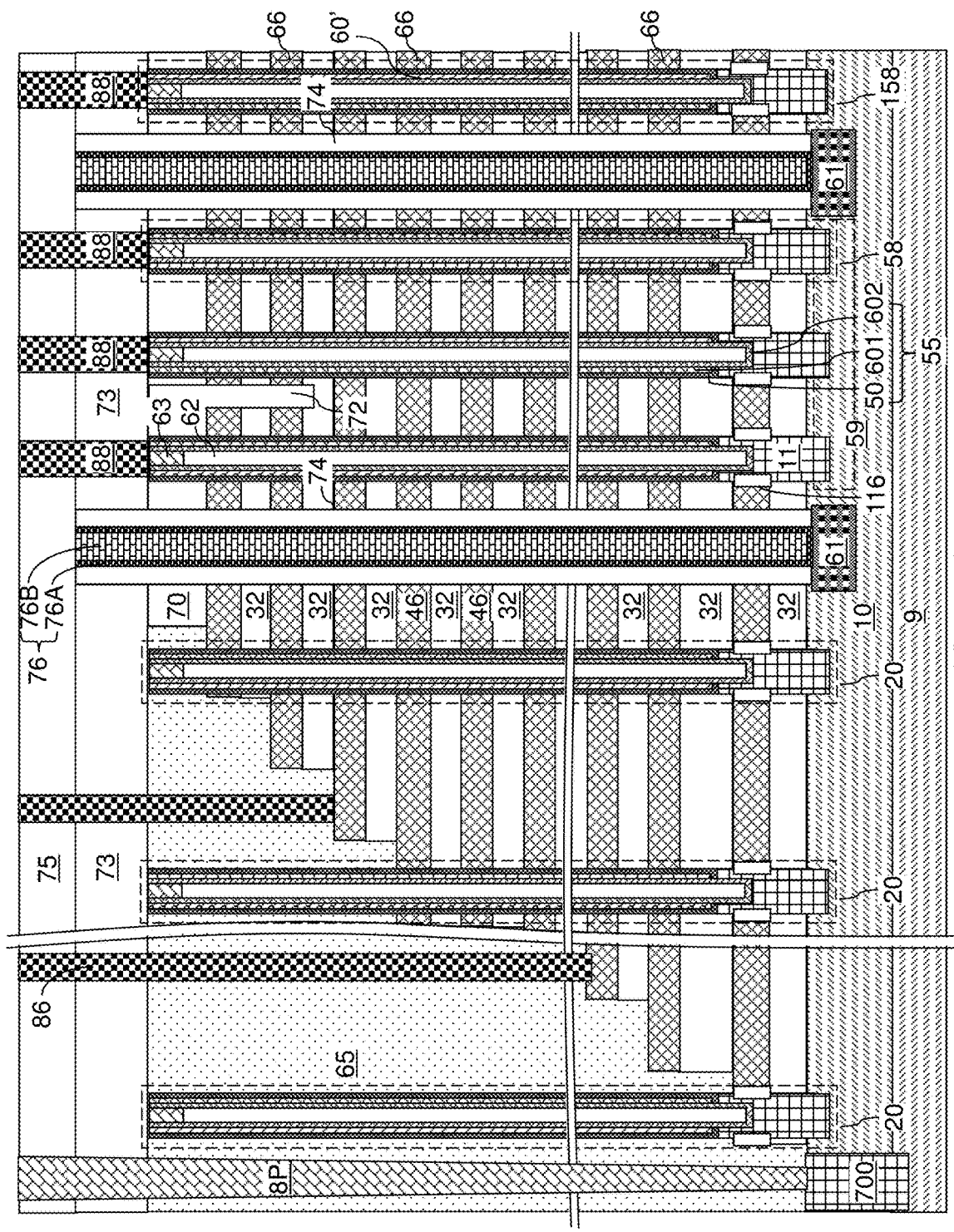
FIG. 13A is a schematic vertical cross-sectional view of the exemplary structure after formation of additional contact via structures according to an embodiment of the present disclosure.
Figure 13B:
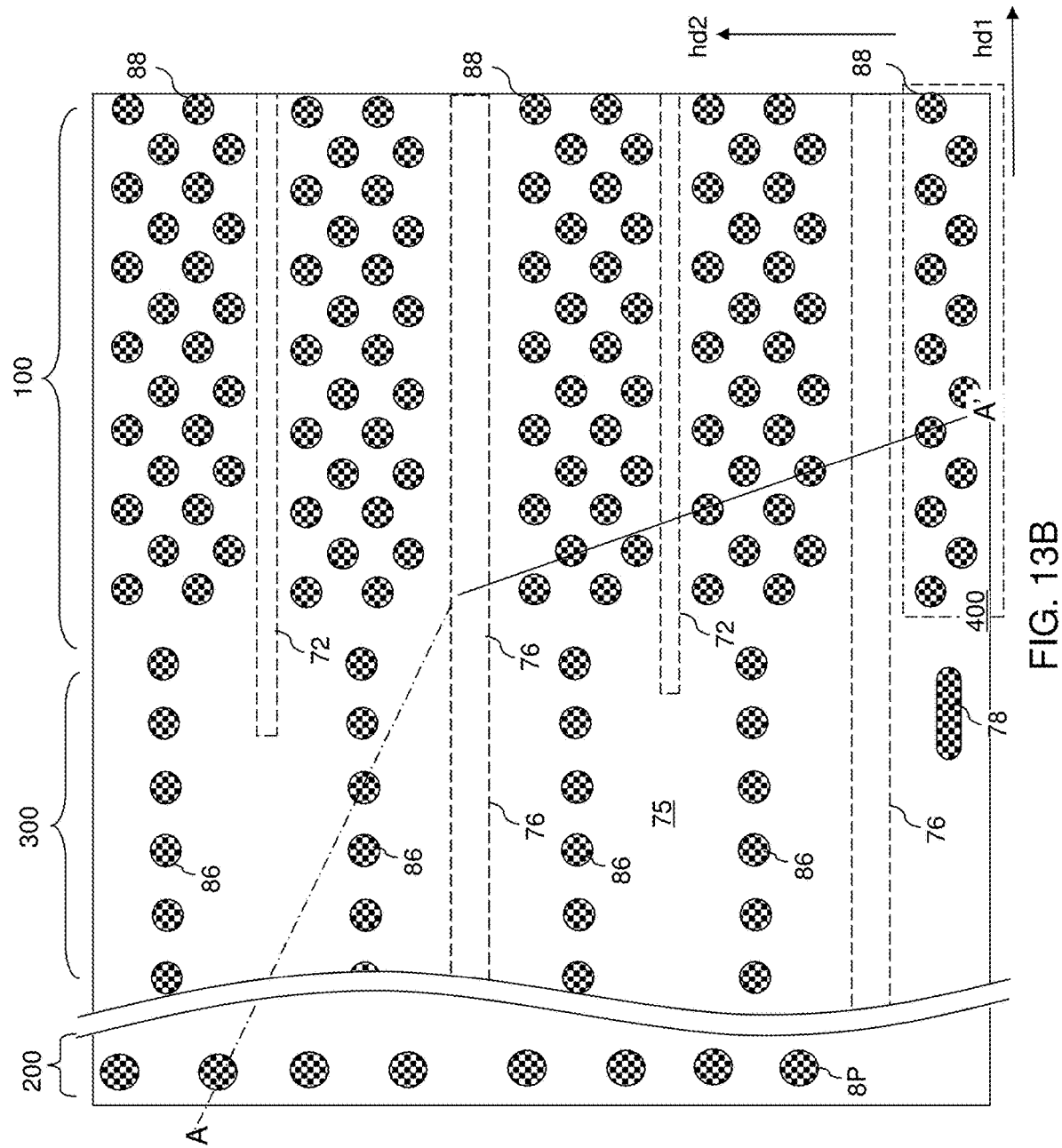
FIG. 13B is a top-down view of the exemplary structure of FIG. 13A. The vertical plane A-A' is the plane of the schematic vertical cross-sectional view of FIG. 13A.

Referring to FIGS. 13A and 13B, a via level dielectric layer 75 is formed over the contact level dielectric layer. Additional contact via structures (88, 86, 78, 8P) can be formed through the via level dielectric layer 75, contact level dielectric layer 73, and optionally through the retro-stepped dielectric material portion 65. For example, drain contact via structures 88 can be formed through the via level dielectric layer 75 and the contact level dielectric layer 73 on each drain region 63. Word line contact via structures 86 can be formed on the electrically conductive layers 46 in the memory array regions 100 through the contact level dielectric layer 73, and through the retro-stepped dielectric material portion 65. Discharge transistor gate contact via structure 78 can be formed through the contact level dielectric layer 73 on the top surfaces of the contact via structures 68 (i.e., the discharge transistor gate interconnection via structures). Peripheral device contact via structures 8P can be formed through the retro-stepped dielectric material portion 65 directly on respective nodes of the peripheral devices.

Each first alternating stack of insulating layers 32 and electrically conductive layers 46 in the memory array regions 100 comprises a set of stepped surfaces that continuous extends from a bottommost one of the first electrically conductive layers 32 to a topmost one of the first electrically conductive layers 46. The word line contact via structures contact 86 contact a respective one of the first electrically conductive layers 46 through a respective horizontal surface within the set of stepped surfaces.

Figure 14A:
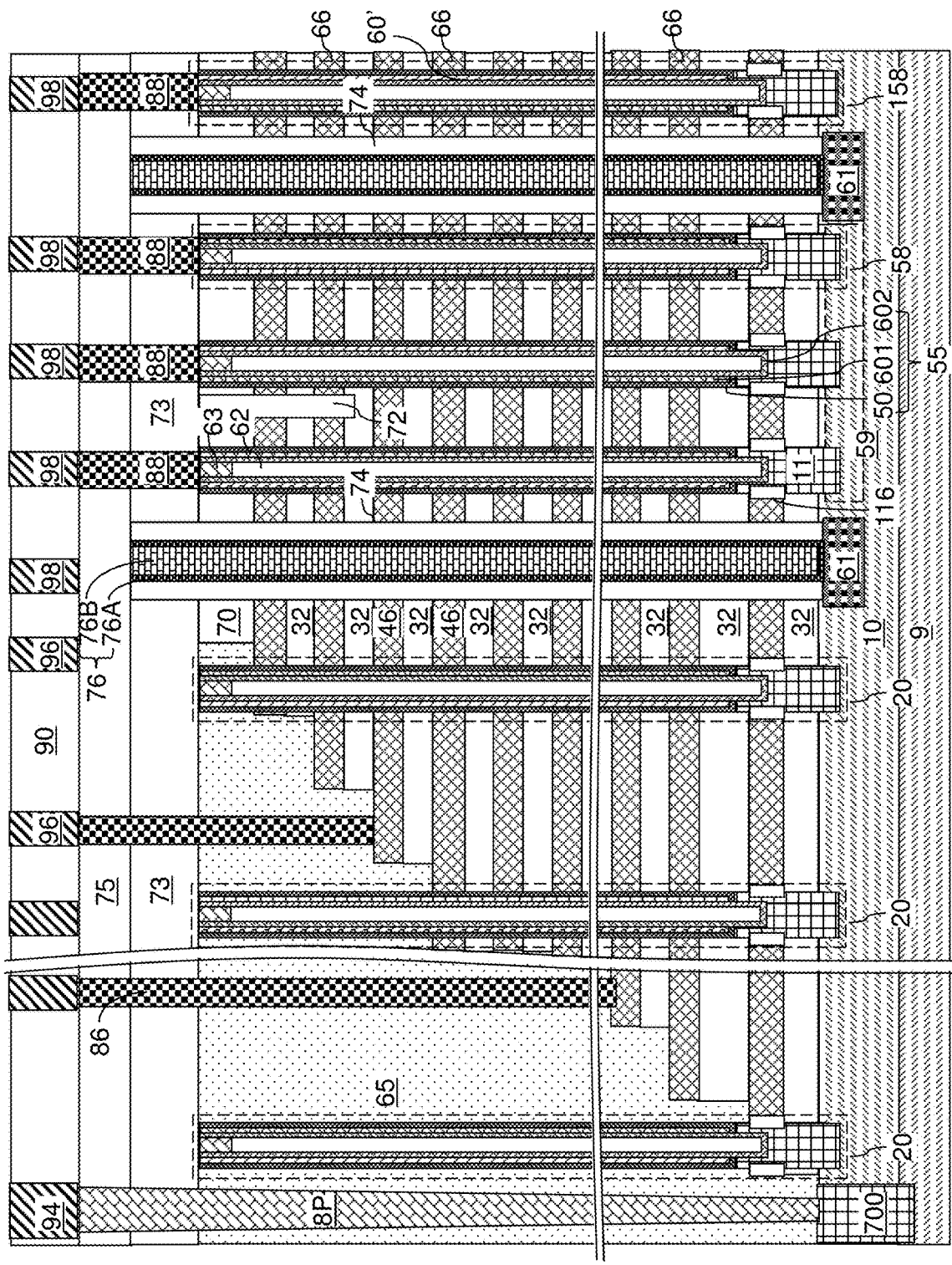
FIG. 14A is a schematic vertical cross-sectional view of the exemplary structure after formation of metal interconnect lines according to an embodiment of the present disclosure.
Figure 14B:
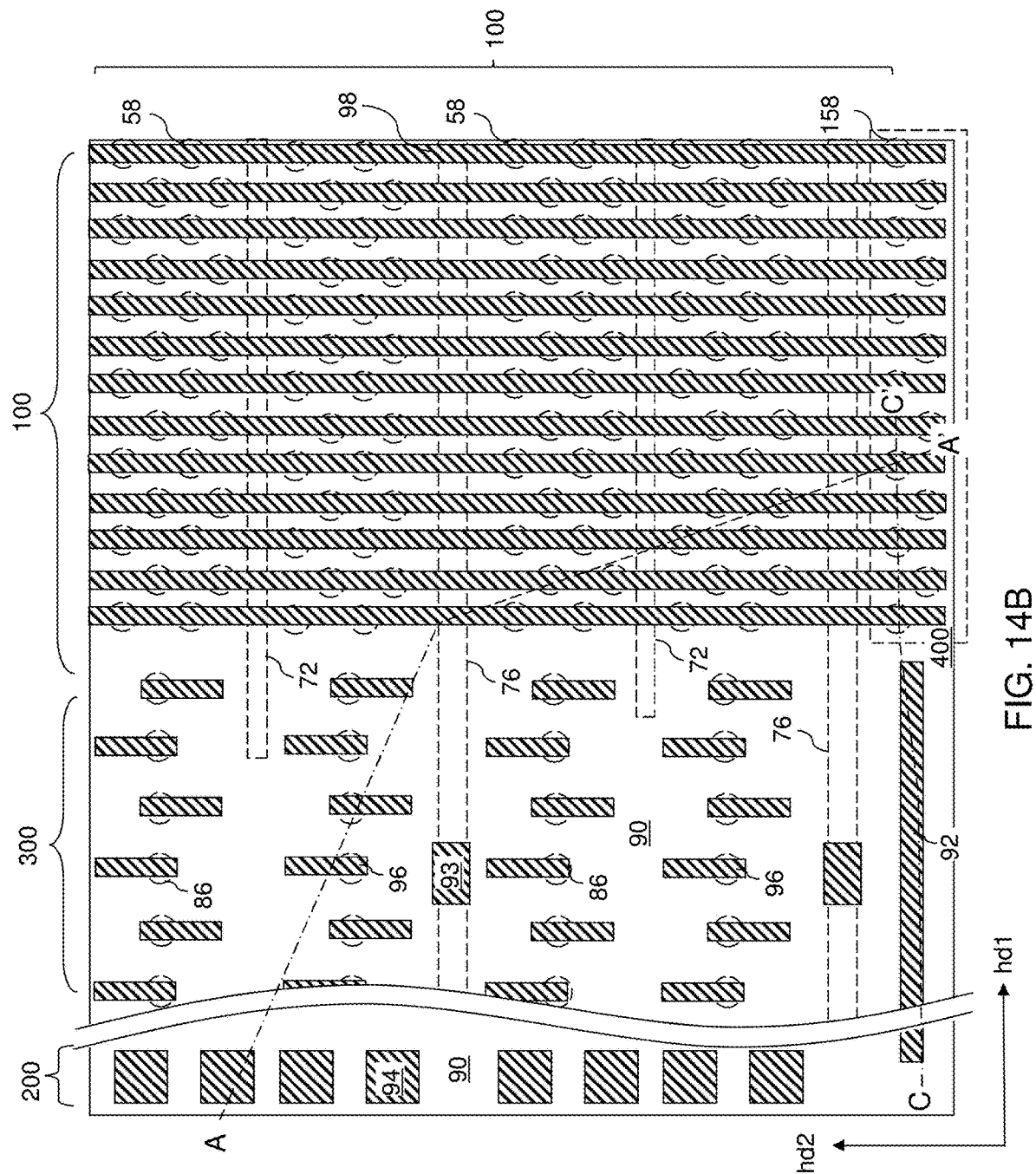
FIG. 14B is a top-down view of the exemplary structure of FIG. 14A. The vertical plane A-A' is the plane of the schematic vertical cross-sectional view of FIG. 14A.
Figure 14C:
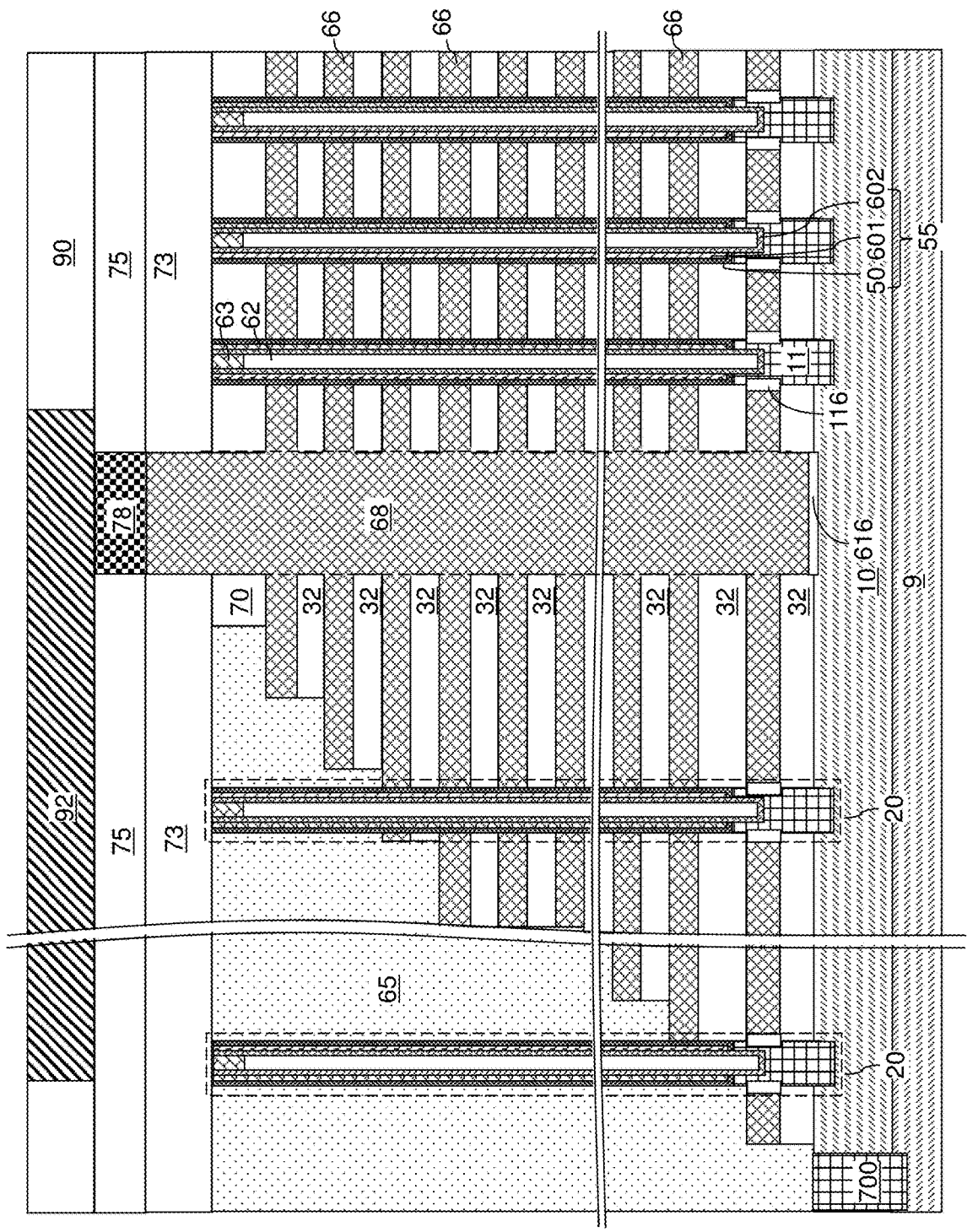
FIG. 14C is a schematic vertical cross-sectional view of the exemplary structure along the vertical plane C-C' of FIG. 11B.

Referring to FIGS. 14A-14D, a line level dielectric layer 90 is deposited over the via level dielectric layer 75. Various metal line structures (98, 96, 94, 92) are formed in the line level dielectric layer 90. The various metal line structure (98, 96, 94, 92) include bit lines 98 that contact a respective subset of the drain contact via structures 88, word-line-connection metal interconnect lines 96 that contact a respective one of the word line contact via structures 86, and peripheral metal interconnect lines 94 that contact peripheral device contact via structures 8P. Each discharge transistor gate contact via structure 78 can be contacted by a gate electrode contact metal line 92. As shown in FIG. 14B, optional source contacts 93 may be provided in contact with the source 61 contact via structures 76.

The bit lines 98 are electrically connected to upper ends of a respective subset of the vertical semiconductor channels 60 in the memory stack structures 55 in the memory array region(s) 100 and a respective subset of the vertical discharge transistor channels 60' through respective drain regions 63. Each bit line 98 is electrically connected to at least one vertical discharge transistor channel 60', which may be a single vertical discharge transistor channel 60' or a plurality of vertical discharge transistor channels 60'. In some embodiments, each of the bit lines 98 is electrically connected to two or more vertical discharge transistor channels 60' controlled by a common gate electrode (66, 68), which includes a set of electrically conductive layers 66 located between each neighboring pair of insulating layers 32 in a respective discharge transistor region 400 and physically connected among one another through the contact via structure 68.

In one embodiment, the memory stack structures 55 are arranged in rows that extend along the first horizontal direction hd1, and the bit lines 98 laterally extend along the second horizontal direction hd2. In one embodiment, the first alternating stacks and the second alternating stacks can be laterally spaced from each other by dielectric wall structures such as the insulating spacers 74. The dielectric wall structures can vertically extend through levels of each layer within the first alternating stacks and the second alternating stacks, and can laterally extend along the first horizontal direction hd1.

Figure 14D:
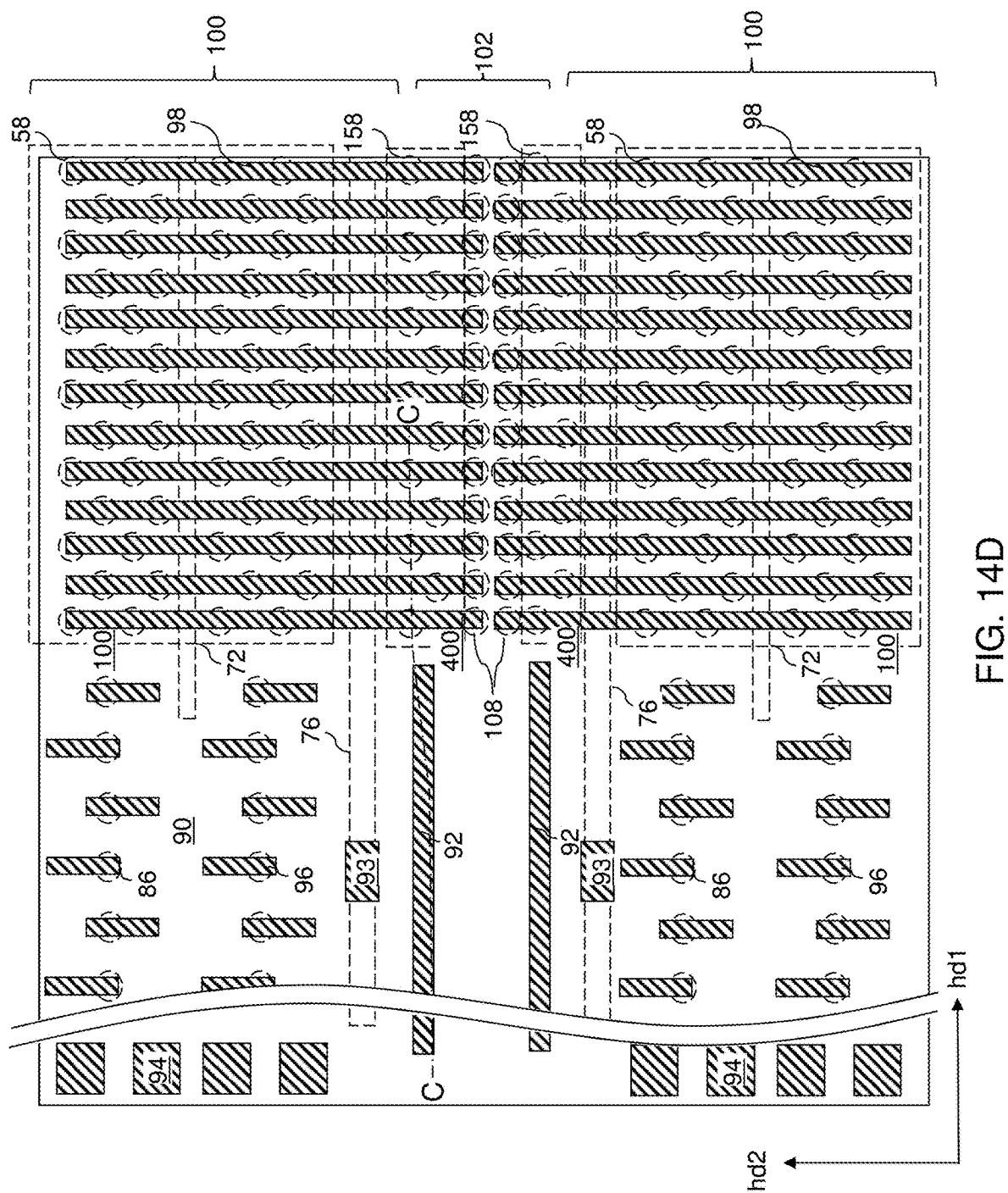
FIG. 14D is another top-down view of the exemplary structure of FIGS. 14A-14C that includes a different area than the area of FIG. 14B.

As shown in FIG. 14D, a bit line tap region 102 may be located between two memory array regions (e.g., memory block regions) 100. The bit line tap region 102 includes through-memory-level via structure 108 which connect the sense amplifiers 700 located below the memory array regions 100 to bit lines 98 located above the memory array regions 100.

Figure 15A:
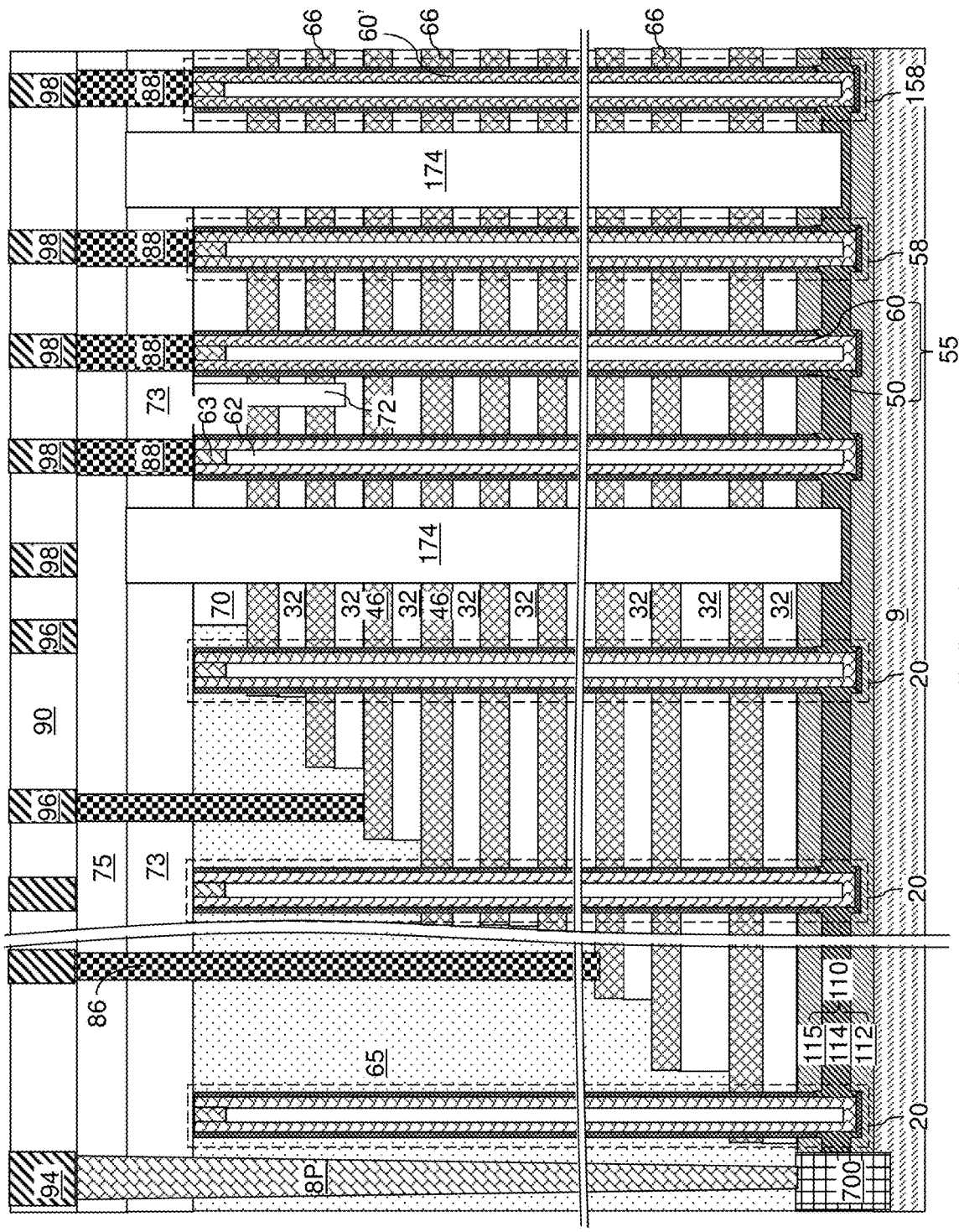
FIGS. 15A and 15B are schematic vertical cross-sectional views of alternative configurations of the exemplary structure according to embodiments of the present disclosure.

Referring to FIG. 15A, an alternative configuration of the exemplary structure according to an embodiment of the present disclosure is illustrated. The alternative configuration can be derived from the exemplary structure of FIGS. 14A-14D by providing in-process source level material layers in lieu of the semiconductor material layer. The in-process source level material layers can include a lower source level material layer 112, a sacrificial source level material layer (not shown), and an upper source level material layer 115. A source level cavity can be formed by etching the sacrificial source level material layer selective to the upper source level material layer 115 and the lower source level material layer 112 after formation of the backside trenches 79 by providing an isotropic etchant into the backside trenches 79. Physically exposed portions of the memory films 50 can be removed by a subsequent isotropic etch. A source contact semiconductor layer 114 having a doping of the second conductivity type can be formed in the volume of the source cavity. The lower source level material layer 112, the source contact semiconductor layer 114, and the upper source level material layer 115 collectively constitute source level material layers 110 that replace the semiconductor material layer 10. After replacement of the sacrificial material layers 42 with electrically conductive layers 46 and after formation of contact via structures 68 (i.e., the discharge transistor gate interconnection via structures), a dielectric wall structure 174 can be formed within each backside trench 79.

Figure 15B:
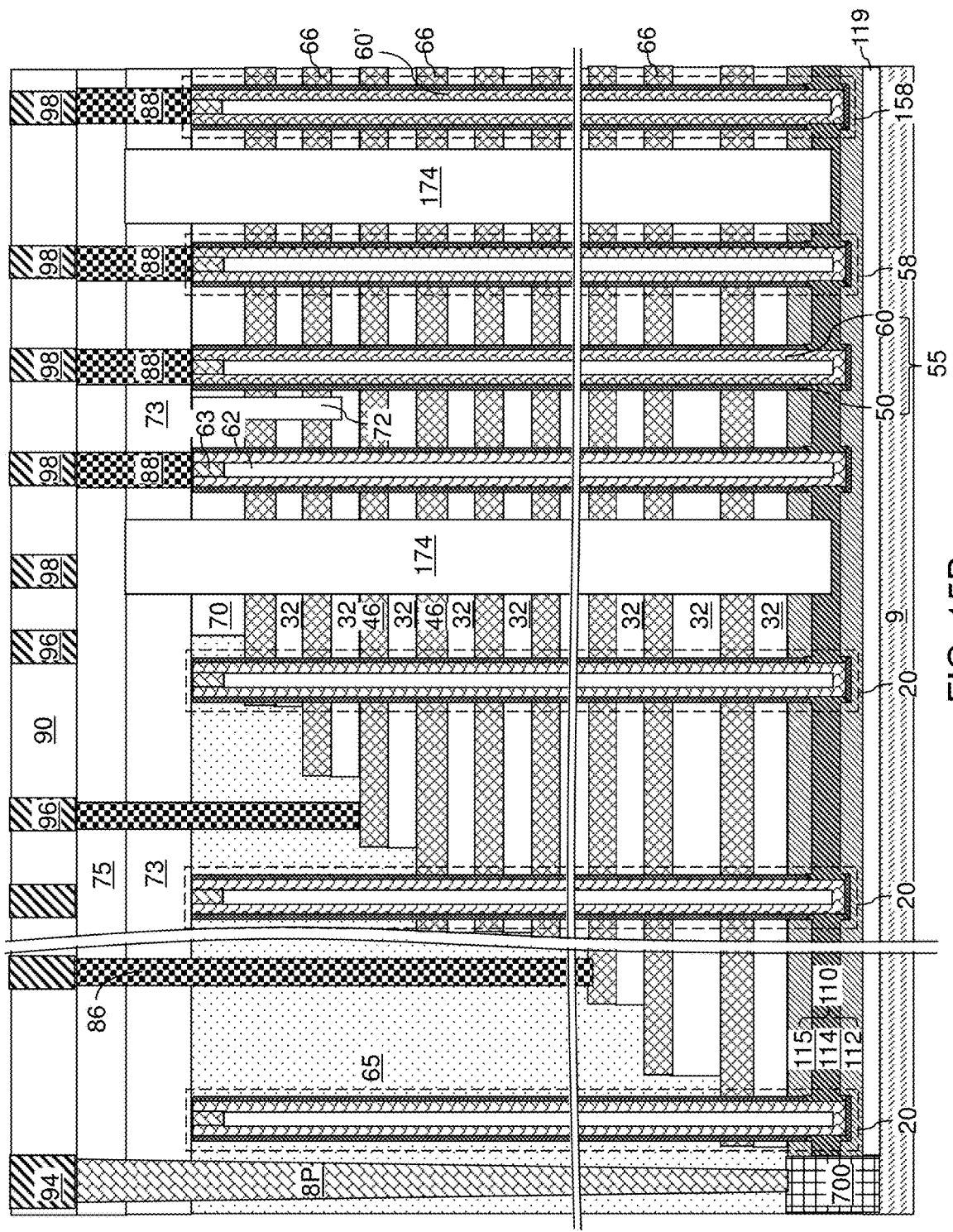

FIG. 15B illustrates another alternative configuration of the exemplary structure according to another embodiment of the present disclosure. The structure of FIG. 15B is identical to the structure of FIG. 15B except that the structure of FIG. 15B includes an insulating layer 119 between the substrate 9 and the source level material layers 110. In this embodiment, the source level material layers 110 form an electrically floating buried source line. The insulating layer 119 may comprise any suitable insulating material, such as silicon oxide, metal oxide (e.g., aluminum oxide), etc.

Figure 16:
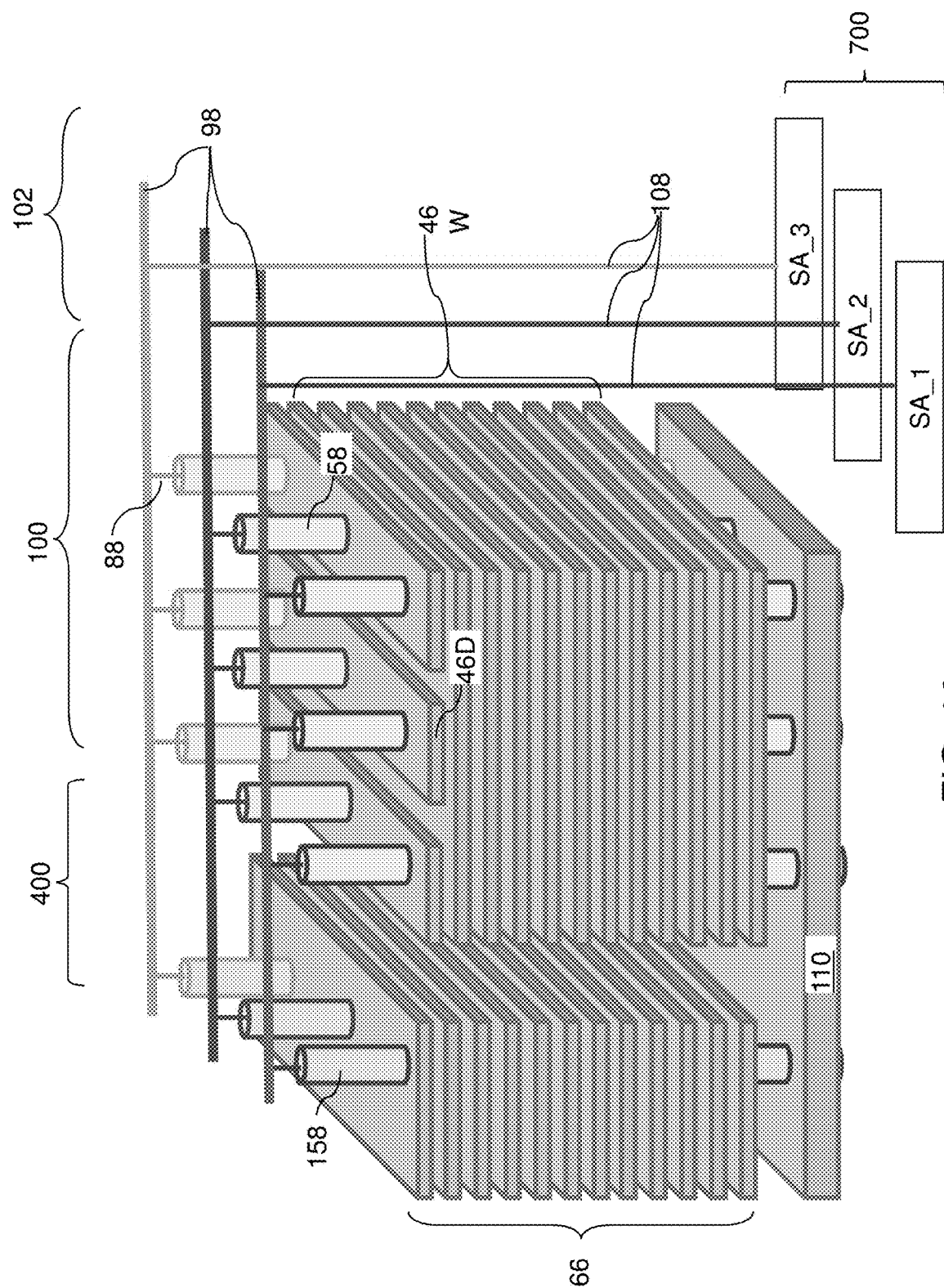
FIG. 16 is a schematic bird's eye view of an exemplary structure according to an embodiment of the present disclosure.

Referring to FIG. 16, a schematic bird's eye view of the exemplary structure of FIG. 15A is illustrated. The first electrically conductive layers 46 within a first alternating stack of first insulating layers (omitted for clarity) and the first electrically conductive layers 46 include word-line-level electrically conductive layers 46W that are shared for each cluster (e.g., block) of memory opening fill structures 58 and drain select gate electrodes 46D that are shared for strings of memory opening fill structures 58 (which are subsets within each cluster). Thus, the upper first electrically conductive layers 46 comprise multiple discrete drain select gate electrodes 46D, and the remaining first electrically conductive layers 46 comprise word-line-level electrically conductive layers (i.e., word lines) 46W and source select gate electrodes (not shown for clarity) that underlie the multiple discrete drain select gate electrodes 46D. Each of the memory stack structures 55 is laterally enclosed by a respective one of the multiple discrete drain select gate electrodes 46D and by each of the word-line-level electrically conductive layers 46W.

The second electrically conductive layers 66 within a second alternating stack of second insulating layers (omitted for clarity) and second electrically conductive layers 66 include vertical discharge transistor gate electrode layers 66 (if they are not shorted to each other) or (66, 68) (if they are shorted to each other). Each of the vertical discharge transistor channels 60' is laterally enclosed by each of the second electrically conductive layers 66.

A row of sense amplifiers (SA_1, SA_2, SA_3, etc.) is located on the substrate (9, 10). The sense amplifiers (SA_1, SA_2, SA_3, etc.) may be a subset of the semiconductor devices 700. Each of the sense amplifiers (SA_1, SA_2, SA_3, etc.) includes a respective input node that is connected to a respective one of the bit lines 98 through a respective through-memory-level via structure 108 that vertically extends through each level of the first electrically conductive layers 46 in the bit line tap region 102. In one embodiment, each of the through-memory-level via structure 108 is laterally spaced from the second alternating stack by the first alternating stack.

Figure 17:
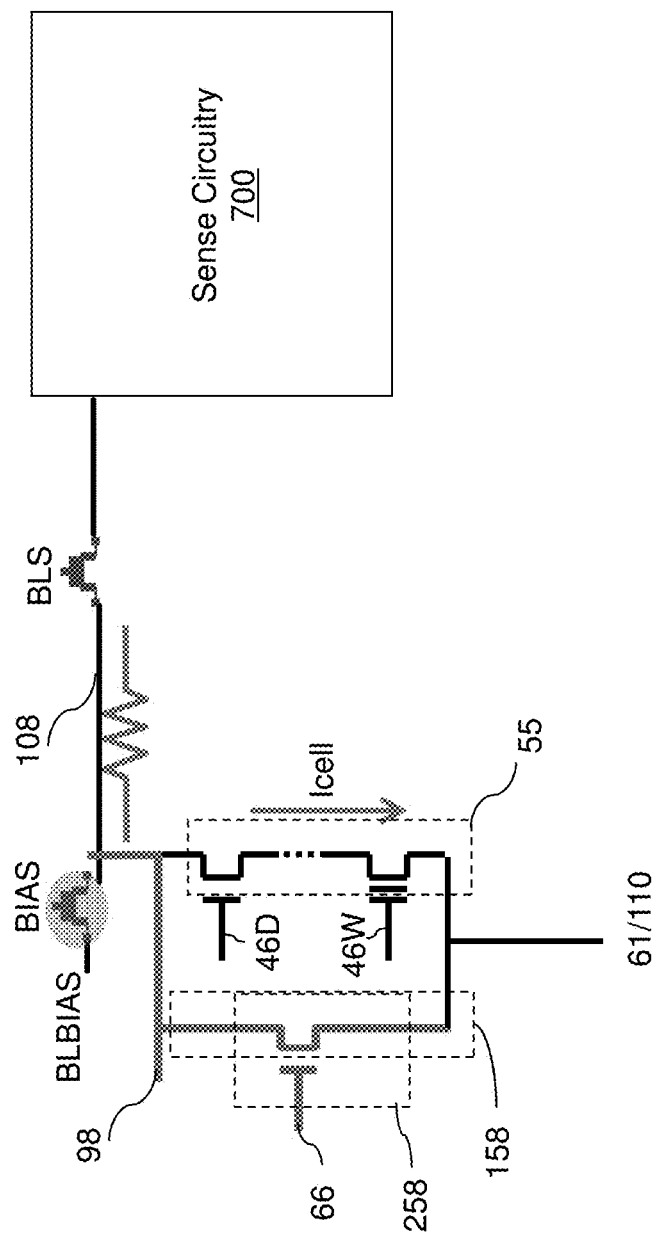
FIG. 17 is a circuit schematic of a bit line discharge transistor according to an embodiment of the present disclosure.

Referring to FIG. 17, a circuit schematic of a bit line discharge transistor and a memory stack structure 55 is shown. The bit line discharge transistor includes a discharge transistor pillar structures 158 filling a discharge transistor opening 149 and a gate electrode 66 or (66, 68). The memory stack structure 55 includes a vertical semiconductor channel 60 and a memory film 50. A bit line bias voltage source BLBIAS is connected to the through-memory-level via structure 108 through a bit line bias source switch BIAS. A sense circuitry including a sense amplifier 700 is connected to the through-memory-level via structure 108 and the bit line 98 through a bit line selector switch BLS.

During operation of a three-dimensional memory device including multiple instances of the circuit of FIG. 17, electrical charge within the bit lines 98 can be discharged by turning on the vertical discharge transistors 258 while the vertical semiconductor channels 60 of the memory stack structures 55 are turned off. The charge may be discharged either into the substrate (9, 10) or into the source level material layers 110 through the turned on vertical discharge transistors 258 depending on the configuration of the device.

Figure 18:
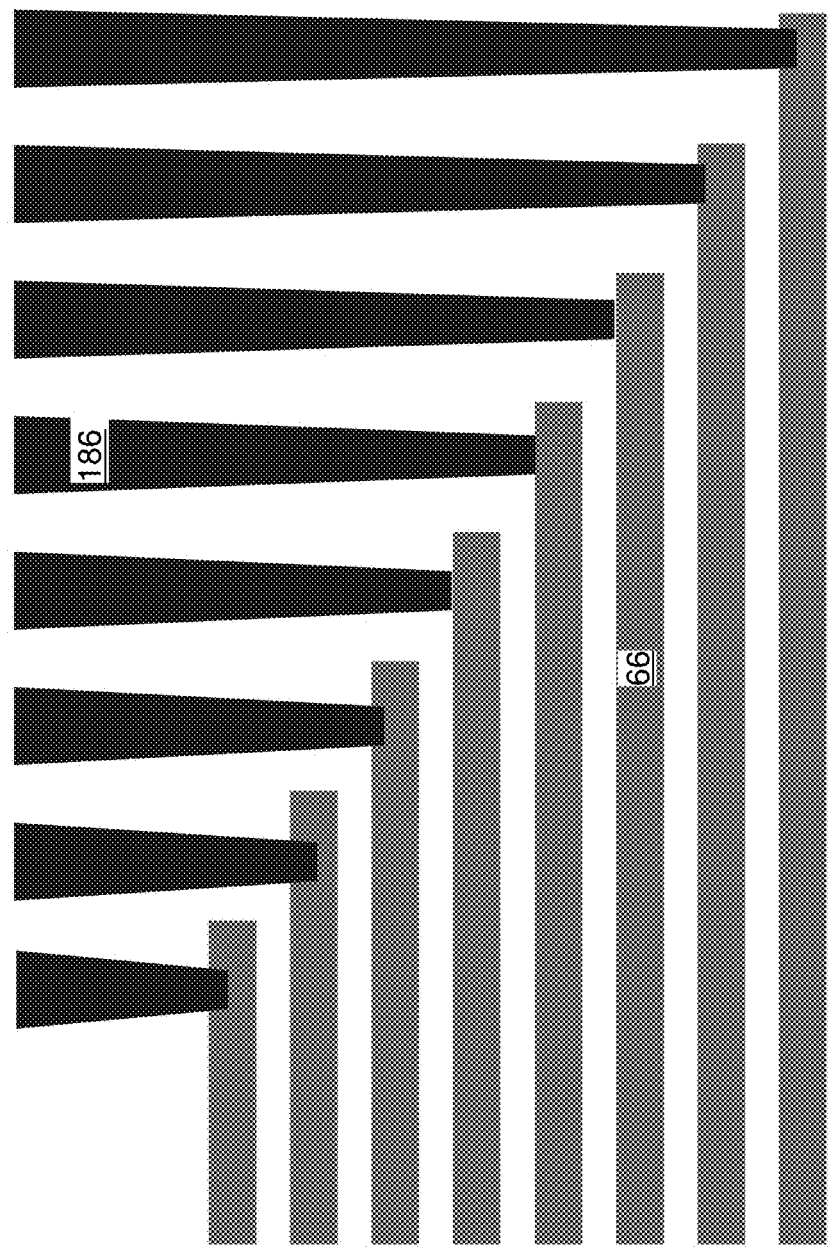
FIG. 18 is a vertical cross-sectional view of another configuration of the exemplary structure according to an embodiment of the present disclosure.

For example, referring to FIG. 18, a read voltage can be applied to the gate electrode contact via structures 188 that contact a respective one of the second electrically conductive layers 66 (i.e., the vertical discharge transistor gate electrodes 66). The read voltage turns on the vertical discharge transistor 258 which permits the bit lines 98 to be discharged. In this configuration, the contact via structure 68 (i.e., the discharge transistor gate interconnection via structure) may be omitted and the vertical discharge transistor 258 can contain separate gate electrodes 66. In one embodiment, the one or more gate electrodes of the vertical discharge transistors 258 may be controlled by a separate word line driver circuit from the word line driver circuit that controls the operation of the word lines 46W.

Figure 19:
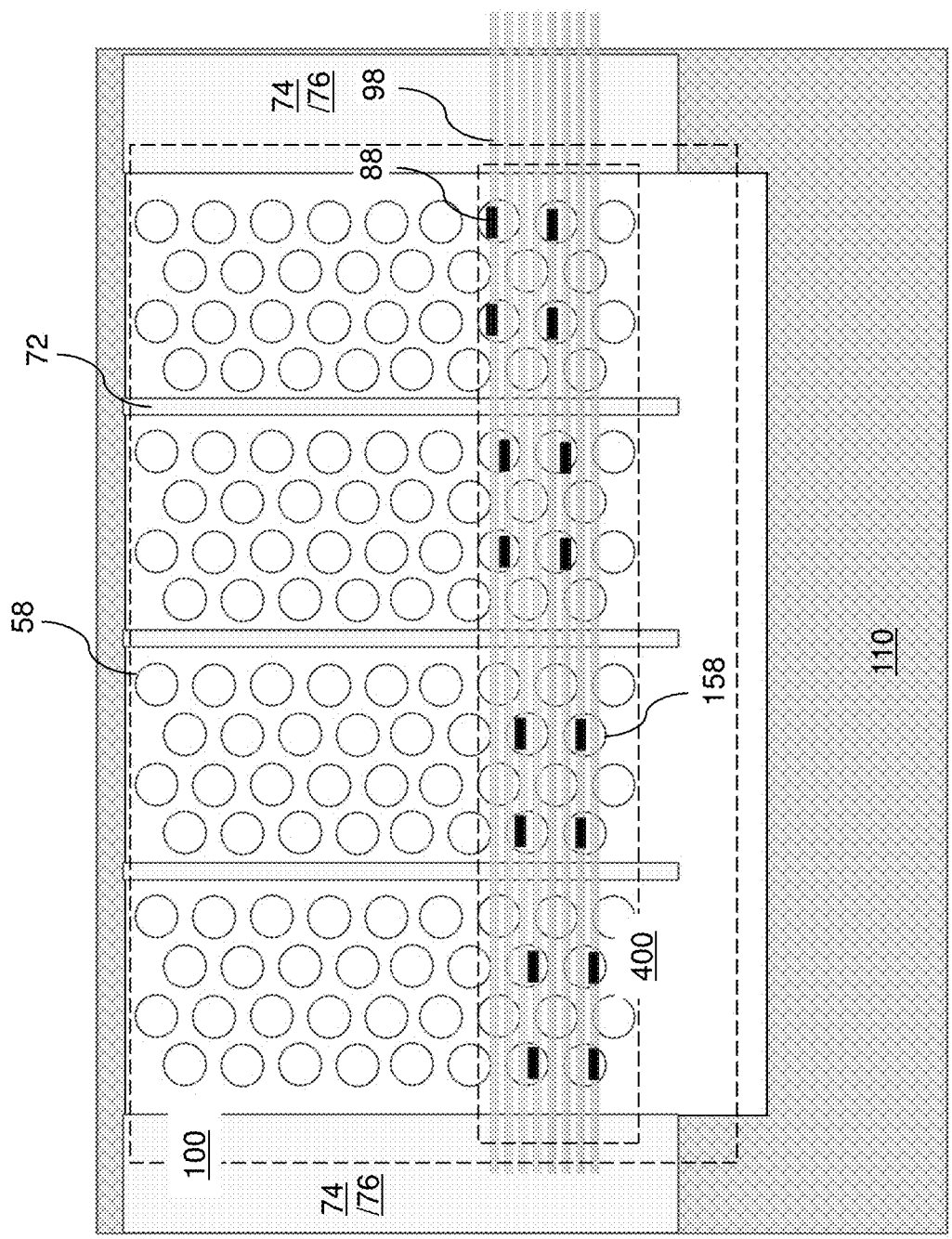
FIG. 19 is a plan view of an alternative configuration of the exemplary structure according to an embodiment of the present disclosure.

Referring to FIG. 19, one configuration of the exemplary structure is illustrated, in which the discharge transistor region 400 is located inside a memory array region 100. In this case, each of the bit lines 98 may be electrically connected to two or more vertical discharge transistor channels 60' controlled by the common gate electrode, which comprises the gate electrode layers 66. Alternatively, each of the bit lines 98 may be electrically connected to only a single vertical discharge transistor channel 60'.

Figure 20:
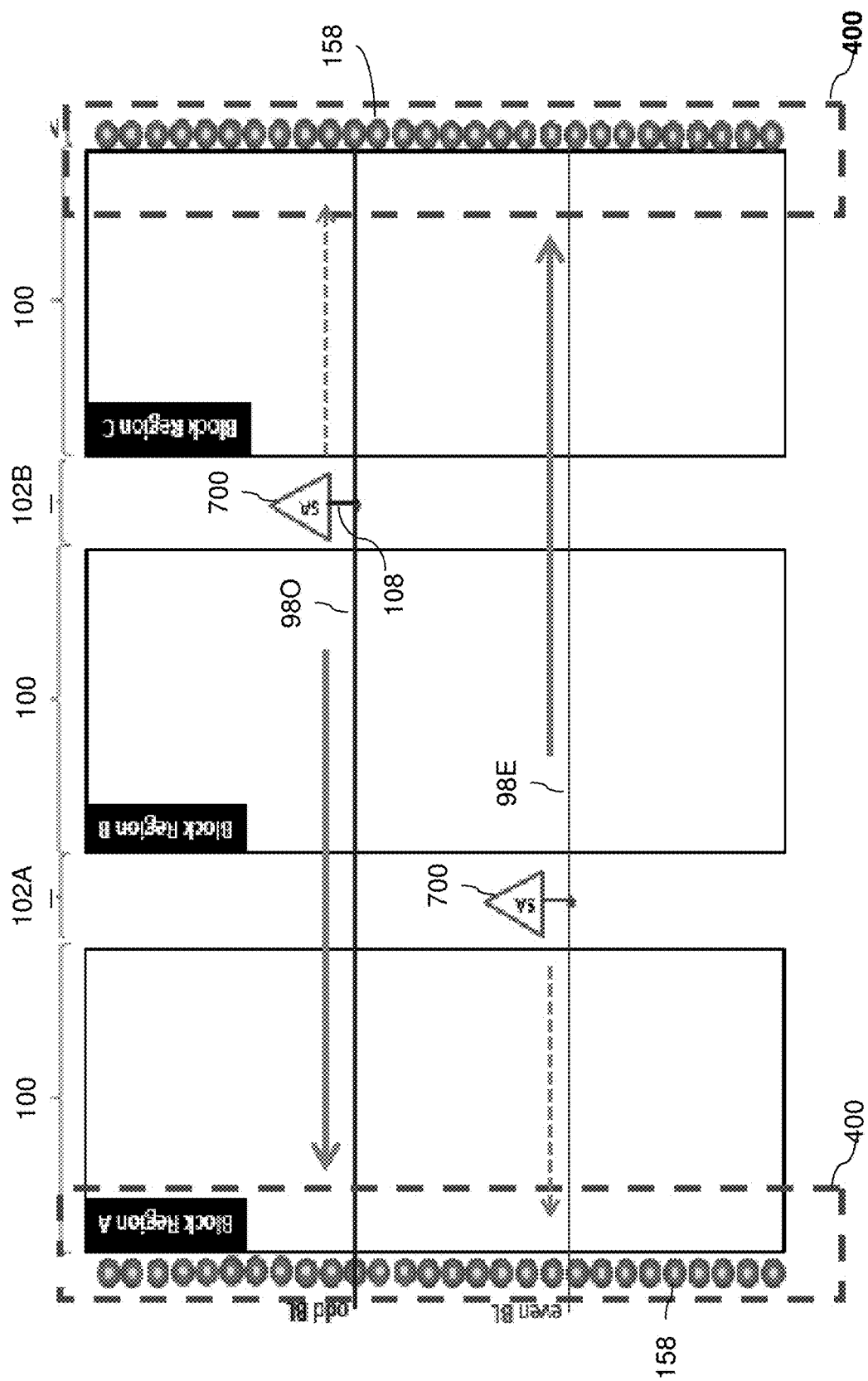
FIG. 20 is a plan view of yet another alternative configuration of the exemplary structure according to an embodiment of the present disclosure.

FIG. 20 illustrates an alternative embodiment in which discharge transistor regions 400 is located outside the memory array regions 100. For example, the discharge transistor regions 400 can be located at the odd and even bit line edges of the end memory array regions 100A and 100C (e.g., outside memory block regions A and C). The sense amplifiers 700 are connected to the bit lines 98 by the through-memory-level via structures 108 which are located in the bit line tap regions (102A, 102B). The odd bit line sense amplifiers can activate the odd bit lines 98O in memory block regions A and B (100A, 100B), while the even bit line sense amplifiers can at the same time activate the even bit lines 98E in memory block regions B and C (100B, 100C) in the opposite direction as shown by the solid arrows in FIG. 20. This reduces the capacitive coupling between odd and even bit lines in memory block regions A and C. The sense amplifiers can also reverse the direction in which the odd and even bit lines are activated as shown by the dashed lines in FIG. 20.

Generally, a row of sense amplifiers 700 can be located on the substrate (9, 10). The row of sense amplifiers 700 can include a respective input node that is connected to a respective one of the bit lines 98 through a respective through-memory-level via structure 108 that vertically extends through each level of the first electrically conductive layers 46. Each of the through-memory-level via structures 108 can be located in a respective bit line tap region (102A, 102B) between the memory array regions 100. In some embodiments, each of the through-memory-level via structures 108 is laterally spaced from the second alternating stack (32, 66) by the first alternating stack (32, 46). In some embodiments, the three-dimensional memory device can further comprise additional alternating stacks of additional insulating layers 32 and additional electrically conductive layers 46 located over the substrate (9, 10), additional memory stack structures 55 extending through a respective one of the additional alternating stacks and including additional vertical semiconductor channels 60, and additional drain regions 63 located on a top end of a respective one of the additional vertical semiconductor channels 60. The bit lines 98 can be electrically connected to a respective subset of the additional drain regions 63. A first subset of the through-memory-level via structures 108 is located in the bit line tap region 102A between the first alternating stack in memory array region 100A and an adjacent one of the additional alternating stacks in memory array region 100B, and a second subset of the through-memory-level via structures 108 in the bit line tap region 102B is located between a neighboring pair among the additional alternating stacks located in memory array regions 100B and 100C.

Figure 21:
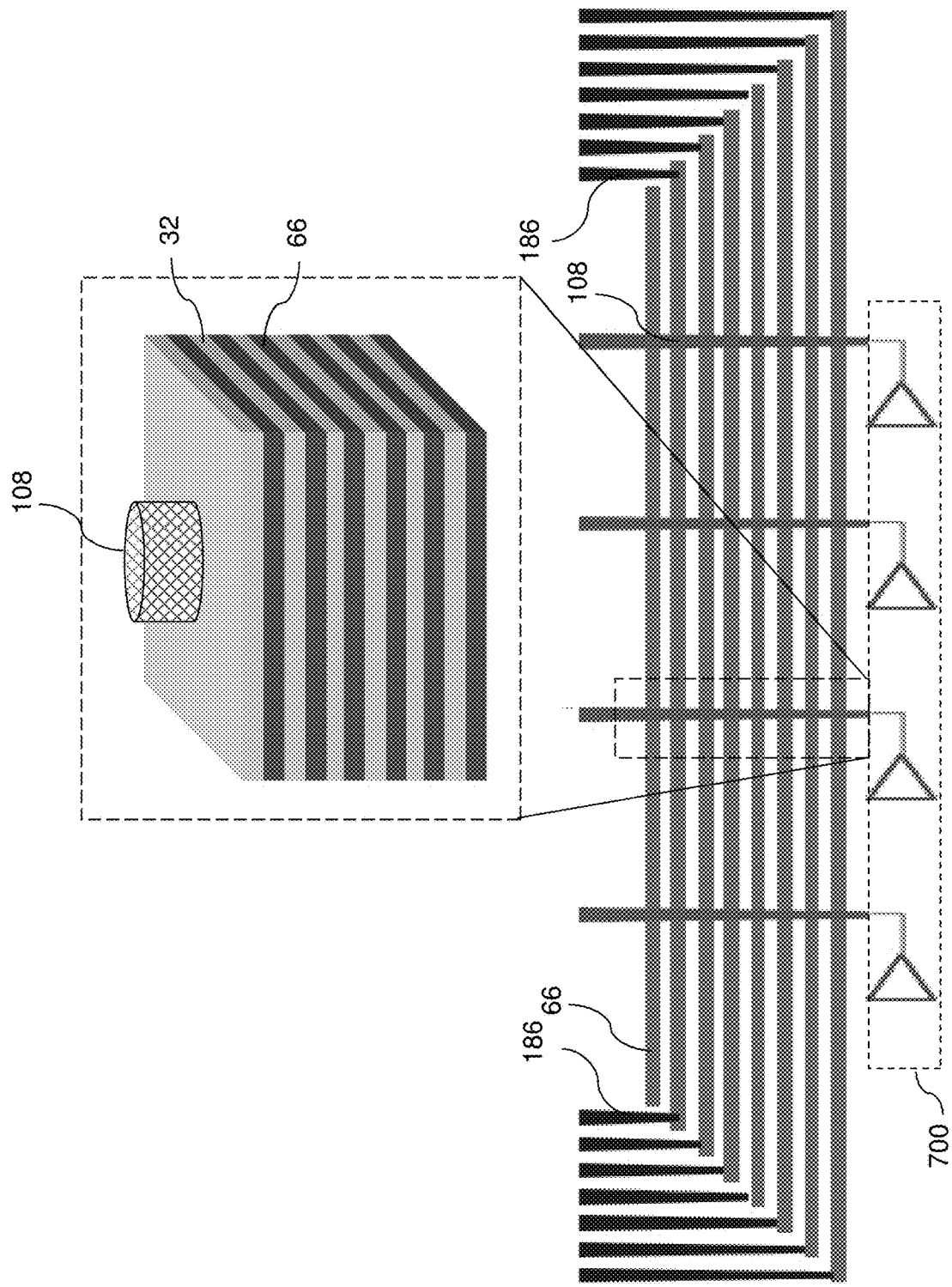
FIG. 21 is a vertical cross-sectional view of still another configuration of the exemplary structure according to an embodiment of the present disclosure and an inset including a perspective view of a portion of the exemplary structure.

Referring to FIG. 21, another configuration of the exemplary structure is illustrated, in which the through-memory-level via structures 108 are electrically connected (i.e., shorted) to the second electrically conductive layers 66 (i.e., the gate electrode layers of the vertical discharge transistors). In this embodiment, a separate word line driver is not required for the second electrically conductive layers 66. Instead, the second electrically conductive layers 66 (i.e., gate electrode layers of the vertical discharge transistors 258) are activated when the through-memory-level via structures 108 are activated (i.e., when current passes through the through-memory-level via structures 108). In this embodiment, the structure 68 can be omitted.

Referring to all drawings and various embodiments of the present disclosure, a three-dimensional memory device is provided, which comprises: a first alternating stack of first insulating layers 32 and first electrically conductive layers 46 located over a substrate (9, 10); memory stack structures 55 extending through the first alternating stack, wherein each of the memory stack structures 55 comprises a memory film 50 and a vertical semiconductor channel 60; first drain regions 63 located on a top end of a respective one of the vertical semiconductor channels 60; bit lines 98 electrically connected to a respective subset of the first drain regions 63 and overlying the memory stack structures 55; a second alternating stack of second insulating layers 32 and second electrically conductive layers 66 located over the substrate (9, 10) and laterally spaced from the first alternating stack; and vertical discharge transistors 258 including a respective vertical discharge transistor channel 60' that extends through the second alternating stack, wherein the second electrically conductive layers 66 comprise one or more gate electrodes of the vertical discharge transistors 258.

In one embodiment, each of the second electrically conductive layers 66 is located at a same vertical distance from the substrate (9, 10) as a respective one of the first electrically conductive layers 46. In one embodiment, a total number of the second electrically conductive layers 66 is the same as a total number of the first electrically conductive layers 46 (when the different portions of the drain-select-level electrically conductive layer 46D are counted as a single drain-select-level electrically conductive layer 46D).

In one embodiment, at least one source region (61 or 114) can be located in a portion of the substrate (9, 10) or above the substrate (9, 10), and can be electrically connected to a bottom end of each of the vertical semiconductor channels 60, and can be electrically connected to a bottom end of each of the vertical discharge transistor channels 60'.

In one embodiment, the memory stack structures 55 comprise vertical NAND strings, the first electrically conductive layers 46 comprise word lines 46W of the vertical NAND strings. In one embodiment, each memory film 50 comprises a first layer stack including a charge storage layer 54 and a tunneling dielectric 56, and each of the vertical discharge transistors 258 comprises a gate dielectric 50 comprising a second layer stack that includes a first gate dielectric sub-layer having a same composition and a same thickness as the charge storage layer 54, and a second gate dielectric sub-layer having a same composition and a same thickness as the tunneling dielectric 56. Each of the vertical semiconductor channels 60 and each of the vertical discharge transistor channels 60' comprise a same doped semiconductor material having a same dopant concentration.

The exemplary structures can include a three-dimensional memory device. In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46W) in a first device level of the array of monolithic three-dimensional NAND strings can be located over another memory cell (as embodied as another portion of the charge storage layer 54 at a level of another electrically conductive layer 46W) in a second device level of the array of monolithic three-dimensional NAND strings. The silicon substrate can contain an integrated circuit comprising a driver circuit (as embodied as a subset of the least one semiconductor device 700) for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels {60 or (59, 11, 60)}, wherein at least one end portion 60 of each of the plurality of semiconductor channels {60 or (59, 11, 60)} extends substantially perpendicular to a top surface of the substrate (9, 10) and comprises a respective one of the vertical semiconductor channels 60; and a plurality of charge storage elements (as embodied as portions of the memory films 50, i.e., portions of the charge storage layer 54). Each charge storage element can be located adjacent to a respective one of the plurality of semiconductor channels {60 or (59, 11, 60)}.

In one embodiment the vertical discharge transistor 258 can induce high speed equalization in multi-level cell state sensing, especially on far side memory block region, such as memory array regions 100A and 100C on the edge of the array, as shown in FIG. 20. The vertical discharge transistors 258 can be employed to discharge the bit lines 98 prior to a sensing operation to reduce a sense time. Furthermore, sense amplifier area bee reduced while having the same bit line length (without dividing plane) does to the faster bit line response. Finally, the vertical discharge transistor 258 does not require a major process change from three dimensional NAND memory device process steps and takes up a very small amount of space.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
a first alternating stack of first insulating layers and first electrically conductive layers located over a substrate;
memory stack structures extending through the first alternating stack, wherein each of the memory stack structures comprises a memory film and a vertical semiconductor channel;
first drain regions located on a top end of a respective one of the vertical semiconductor channels;
bit lines electrically connected to a respective subset of the first drain regions overlying the memory stack structures;
a second alternating stack of second insulating layers and second electrically conductive layers located over the substrate and laterally spaced from the first alternating stack; and
vertical discharge transistors including a respective vertical discharge transistor channel that extends through the second alternating stack, wherein the second electrically conductive layers comprise one or more gate electrodes of the vertical discharge transistors, wherein the vertical discharge transistors are configured to discharge the bit lines.

2. The three-dimensional memory device of claim 1, wherein each of the second electrically conductive layers is located at a same vertical distance from the substrate as a respective one of the first electrically conductive layers.

3. The three-dimensional memory device of claim 1, wherein a total number of the second electrically conductive layers is the same as a total number of the first electrically conductive layers.

4. The three-dimensional memory device of claim 1, further comprising at least one source region located in a portion of the substrate or above the substrate and electrically connected to a bottom end of each of the vertical semiconductor channels and electrically connected to a bottom end of each of the vertical discharge transistor channels.

5. The three-dimensional memory device of claim 4, wherein:
the memory stack structures comprise vertical NAND strings; and
the first electrically conductive layers comprise word lines of the vertical NAND strings.

6. The three-dimensional memory device of claim 1, wherein:
each memory film comprises a first layer stack including a charge storage layer and a tunneling dielectric;
each of the vertical semiconductor channels and each of the vertical discharge transistor channels comprise a same doped semiconductor material having a same dopant concentration; and
each of the vertical discharge transistors comprises a gate dielectric comprising a second layer stack that includes a first gate dielectric sub-layer having a same composition and a same thickness as the charge storage layer, and a second gate dielectric sub-layer having a same composition and a same thickness as the tunneling dielectric.

7. The three-dimensional memory device of claim 1, wherein:
the memory stack structures are arranged in rows that extend along a first horizontal direction;
the bit lines laterally extend along a second horizontal direction; and
the first alternating stack and the second alternating stack are laterally spaced from each other by a dielectric wall structure that vertically extends in a first direction through levels of each layer within the first alternating stack and laterally extends along the first horizontal direction.

8. The three-dimensional memory device of claim 1, wherein:
the second electrically conductive layers electrically connected among one another by a conductive via structure that contacts each of the second electrically conductive layers; and
the conductive via structure and the second electrically conductive layers constitute a common gate electrode of the vertical discharge transistors.

9. The three-dimensional memory device of claim 8, wherein each of the bit lines is electrically connected to two or more vertical discharge transistor channels controlled by the common gate electrode.

10. The three-dimensional memory device of claim 1, further comprising gate electrode contact via structures that contact a respective one of the second electrically conductive layers, wherein the vertical discharge transistors are turned on by applying a read voltage to the gate electrode contact via structures.

11. The three-dimensional memory device of claim 1, further comprising a row of sense amplifiers located on the substrate and including a respective input node that is connected to a respective one of the bit lines through a respective through-memory-level via structure that vertically extends through each level of the first electrically conductive layers.

12. The three-dimensional memory device of claim 11, wherein the through-memory-level via structure contact the second electrically conductive layers.

13. The three-dimensional memory device of claim 11, further comprising:
additional alternating stacks of additional insulating layers and additional electrically conductive layers located over the substrate;
additional memory stack structures extending through a respective one of the additional alternating stacks and including additional vertical semiconductor channels; and
additional drain regions located on a top end of a respective one of the additional vertical semiconductor channels;
wherein:
each of the through-memory-level via structures is laterally spaced from the second alternating stack by the first alternating stack;
the bit lines are electrically connected to a respective subset of the additional drain regions; and
a first subset of the through-memory-level via structures is located between the first alternating stack and an adjacent one of the additional alternating stacks; and
a second subset of the through-memory-level via structures is located between a neighboring pair of the additional alternating stacks.

14. The three-dimensional memory device of claim 1, wherein:
the first alternating stack comprises a set of stepped surfaces that continuous extends from a bottommost one of the first electrically conductive layers to a topmost one of the first electrically conductive layers; and the three-dimensional memory device comprises word line contact via structures contacting a respective one of the first electrically conductive layers through a respective horizontal surface within the set of stepped surfaces.

15. The three-dimensional memory device of claim 1, wherein the memory stack structures are arranged in memory array regions, and the vertical discharge transistors are located outside the memory array regions.

16. The three-dimensional memory device of claim 1, wherein the memory stack structures are arranged in memory array regions, and the vertical discharge transistors are located inside at least one of the memory array regions.

17. A method of operating the three-dimensional memory device of claim 1, comprising turning on the vertical discharge transistors by applying a read voltage to the second electrically conductive layers to discharge electrical charge in the bit lines through the vertical discharge transistors.

18. The method of claim 17, wherein the vertical semiconductor channels of the memory stack structures are turned off when the vertical discharge transistors are turned on.

19. A method of forming a three-dimensional memory device, comprising:
   forming a first alternating stack of first insulating layers and first electrically conductive layers over a substrate, wherein memory stack structures extend through the first alternating stack, and each of the memory stack structures comprises a memory film and a vertical semiconductor channel;
   forming a second alternating stack of second insulating layers and second electrically conductive layers over the substrate, wherein the second alternating stack is laterally spaced from the first alternating stack, vertical discharge transistors including a respective vertical discharge transistor channel extend through the second alternating stack, and the second electrically conductive layers are electrically connected among one another and constitutes a common gate electrode that concurrently switches the vertical discharge transistors;
   forming bit lines that are electrically connected to upper ends of a respective subset of the vertical semiconductor channels and a respective subset of the vertical discharge transistor channels, wherein the vertical discharge transistors are configured to discharge the bit lines.

20. The method of claim 19, wherein the first alternating stack and the second alternating stack are formed by:
   forming a continuous alternating stack of continuous insulating layers and continuous sacrificial material layers;
   forming the memory stack structures, gate dielectrics of the vertical discharge transistors, and the vertical discharge transistor channels through the continuous alternating stack;
   dividing the continuous alternating stack into a first portion including the memory stack structures and a second portion including the vertical discharge transistor channels; and
   replacing remaining portions of the continuous sacrificial material layers with at least one electrically conductive material to form the first alternating stack and the second alternating stack.

\* \* \* \* \*